(12) United States Patent
Aruga et al.

(10) Patent No.: US 10,411,173 B2
(45) Date of Patent: Sep. 10, 2019

(54) LIGHT EMITTING DEVICE AND LIGHT EMITTING MODULE USING THE SAME

(71) Applicant: NICHIA CORPORATION, Anan-shi, Tokushima (JP)

(72) Inventors: Takanori Aruga, Suwa-gun (JP); Yoshiki Endo, Komatsushima (JP); Takuya Yamanoi, Anan (JP); Daisuke Kishikawa, Anan (JP); Yoshitaka Tanaka, Suwa (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/086,873

(22) Filed: Mar. 31, 2016

(65) Prior Publication Data

US 2016/0293813 A1    Oct. 6, 2016

(30) Foreign Application Priority Data

Mar. 31, 2015 (JP) .................................. 2015-074227
Jun. 30, 2015 (JP) .................................. 2015-131489
Feb. 25, 2016 (JP) .................................. 2016-034639

(51) Int. Cl.
| | |
|---|---|
| *H01L 33/00* | (2010.01) |
| *H01L 33/60* | (2010.01) |
| *H01L 33/54* | (2010.01) |
| *H01L 33/58* | (2010.01) |
| *H01L 25/13* | (2006.01) |
| *H01L 33/62* | (2010.01) |

(52) U.S. Cl.
CPC ............. *H01L 33/58* (2013.01); *H01L 25/13* (2013.01); *H01L 33/54* (2013.01); *H01L 33/62* (2013.01); *H01L 2224/48091* (2013.01); *H01L 2224/48465* (2013.01); *H01L 2924/00014* (2013.01)

(58) Field of Classification Search
CPC ......... H01L 33/58; H01L 33/54; H01L 25/13; H01L 33/486; H01L 33/62; H01L 31/09; H01L 2924/00014; H01L 2924/00; H01L 33/56; H01L 33/642
See application file for complete search history.

(56) References Cited

U.S. PATENT DOCUMENTS

| | | | | |
|---|---|---|---|---|
| 6,957,907 | B2 * | 10/2005 | Fischer ................ | A61B 5/0088 362/16 |
| 7,098,485 | B2 * | 8/2006 | Isokawa .................. | H01L 33/54 257/98 |

(Continued)

FOREIGN PATENT DOCUMENTS

| | | |
|---|---|---|
| JP | 2004-228143 A | 8/2004 |
| JP | 2006-114863 A | 4/2006 |

(Continued)

*Primary Examiner* — Mary A Wilczewski
*Assistant Examiner* — Tsz K Chiu
(74) *Attorney, Agent, or Firm* — Hunton Andrews Kurth LLP

(57) ABSTRACT

A light emitting device and light emitting module using the same are provided. The light emitting device includes a substrate, a light-emitting element provided on the substrate, and a light transmissive sealing member covering the light-emitting element on the substrate. The light transmissive sealing member includes a body portion and a lens portion that are sequentially disposed from a substrate side.

22 Claims, 14 Drawing Sheets

(56) References Cited

U.S. PATENT DOCUMENTS

| | | | |
|---|---|---|---|
| 7,213,945 B2* | 5/2007 | Yoneda | H01L 33/58 257/E33.071 |
| 7,875,897 B2* | 1/2011 | Suehiro | H01L 33/56 257/99 |
| 8,115,384 B2* | 2/2012 | Destain | H01L 33/58 313/113 |
| 9,236,543 B2* | 1/2016 | Kim | G02B 17/086 |
| 9,995,461 B2* | 6/2018 | Lee | G02B 19/0028 |
| 2006/0083000 A1 | 4/2006 | Yoon et al. | |
| 2008/0158875 A1 | 7/2008 | Kim et al. | |
| 2008/0203416 A1 | 8/2008 | Konishi et al. | |
| 2009/0279312 A1 | 11/2009 | Yoon et al. | |
| 2011/0242820 A1 | 10/2011 | Yoon et al. | |
| 2011/0272721 A1 | 11/2011 | Butterworth | |
| 2013/0299682 A1 | 11/2013 | Fouquet et al. | |
| 2013/0299860 A1 | 11/2013 | Mineshita | |
| 2014/0043831 A1 | 2/2014 | Yoon et al. | |
| 2014/0133151 A1 | 5/2014 | Kamada | |
| 2014/0300972 A1 | 10/2014 | Sasaki | |
| 2015/0023016 A1 | 1/2015 | Ishihara et al. | |
| 2015/0034993 A1 | 2/2015 | Mineshita | |
| 2015/0263248 A1 | 9/2015 | Mineshita | |
| 2016/0365492 A1 | 12/2016 | Mineshita | |

FOREIGN PATENT DOCUMENTS

| | | |
|---|---|---|
| JP | 2007-49019 A | 2/2007 |
| JP | 2008-166250 A | 7/2008 |
| JP | 2008-235868 A | 10/2008 |
| JP | 2009-51095 A | 3/2009 |
| JP | 2009-051095 A | 3/2009 |
| JP | 2009-158274 A | 7/2009 |
| JP | 2010-278246 A | 12/2010 |
| JP | 2013-64941 A | 4/2013 |
| JP | 2013-526075 A | 6/2013 |
| JP | 2013-187311 A | 9/2013 |
| JP | 2013-238854 A | 11/2013 |
| JP | 2013-254937 A | 12/2013 |
| JP | 2014-099455 A | 5/2014 |
| JP | 2015-023219 A | 2/2015 |

* cited by examiner

LIGHT EMITTING DEVICE AND LIGHT EMITTING MODULE USING THE SAME

CROSS-REFERENCE TO RELATED APPLICATIONS

This application claims the benefit of Japanese Patent Application No. 2015-74227 filed on Mar. 31, 2015, Japanese Patent Application No. 2015-131489 filed on Jun. 30, 2015 and Japanese Patent Application No. 2016-34639 filed on Feb. 25, 2016. The entire disclosures of Japanese Patent Application No. 2015-74227, Japanese Patent Application No. 2015-131489, and Japanese Patent Application No. 2016-34639 are incorporated by reference herein.

BACKGROUND

The present disclosure relates to a light emitting device and a light emitting module.

In recent years, light emitting devices employing light emitting diodes (LEDs) have been widely used in a variety of applications, and LEDs have many advantages including low power consumption, long life, and high reliability. In view of this large and expanding range of uses, light emitting devices require emission properties that are appropriate for a given application. For example, a light-emitting element (e.g., an LED) that emits ultraviolet rays may be used as a light source for hardening ink in an inkjet recorder, as described by Japanese Patent Application No. 2009-51095 A. This inkjet recorder includes a holder that ejects ink from an ink head onto a medium to be printed while moving in a main scanning direction, and a lamp that radiates light to harden the ink ejected from the ink head while moving in the main scanning direction together with the holder.

In the inkjet recorder disclosed in JP 2009-51095 A, an ultraviolet light source is provided that includes a plurality of LEDs arranged in lines as the lamp. However, since the ink head and the ultraviolet light source are positioned relatively close to each other in the inkjet recorder, the light emitted from the light source reflects from the medium or the like and then radiates in the ink head direction and may accidentally harden the ink.

To reduce light radiated in the ink head direction, or in the lateral direction (also known as "stray light"), some inkjet recorders are proposed to devise their entire structures or modify the light-source structure. This may complicate the entire structure of the inkjet recorder or the light-source structure therein, and this may also result in insufficient suppression of the stray light.

These problems are not unique to the inkjet recorder, and other uses of light emitting devices often require appropriate light distribution characteristics in order to reduce the light emitted in unnecessary directions.

SUMMARY

Accordingly, one of the objects of certain embodiments of the present invention is to provide a light emitting device having light distribution characteristics as to be capable of reducing the stray light.

A light emitting device according to embodiments of the present invention includes a substrate, a light-emitting element provided on the substrate, and a light transmissive sealing member covering the light-emitting element on the substrate. The light transmissive sealing member includes a body portion and a lens portion that are sequentially disposed from a substrate side, a first interior angle formed between an upper surface of the substrate and an outer surface of the body portion, wherein the first interior angle is larger than a second interior angle formed between the substrate and an outer surface at a lower end of the lens portion, an outer surface of the lens portion, wherein the outer surface includes an aspheric surface that has a region located between the lower end of the lens portion on a side of the body portion and an apex as an intersection of the outer surface and an optical axis of the light transmissive sealing member, the region having a curvature radius smaller than that of each of the apex side and the lower end side of the lens portion, a first length of the lens portion along the optical axis direction, wherein the first length is longer than a second length of the body portion along the optical axis direction, and a diameter of the body portion, wherein the diameter satisfies the following expression:

$$2.0 \geq Di/Wm \geq 1.4,$$

where Di is a diameter of the body portion and Wm is a maximum width of a light-emitting face of the light-emitting element.

Thus, a light emitting device in accordance with embodiments of the present invention may have light distribution characteristics such that stray light may be reduced or suppressed.

DETAILED DESCRIPTION

Embodiments of the present invention will be described below with reference to the accompanying drawings. Note that these embodiments are exemplary and intended to illustrate the technical concepts of the present invention and is not intended to limit the present invention to any particular embodiment.

First Embodiment

Figure 1:
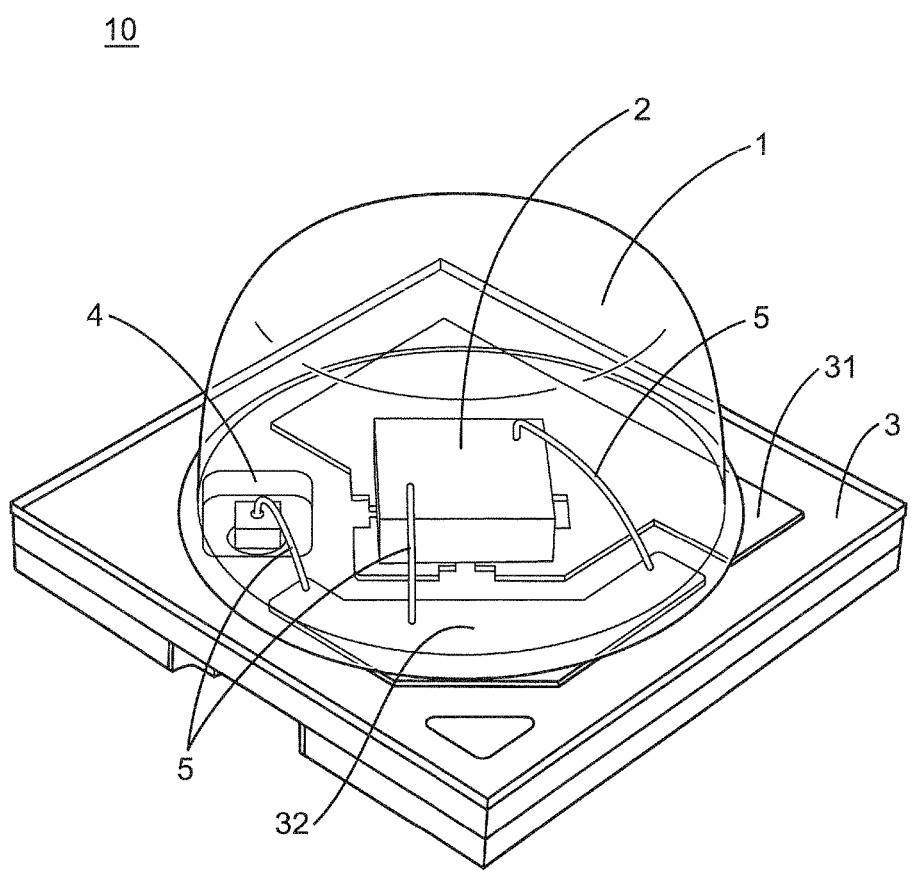
FIG. 1 is a perspective view showing the structure of a light emitting device according to a first embodiment of the present invention.

FIG. 1 is a perspective view showing the structure of a light emitting device 10 according to a first embodiment. As shown in FIG. 1, the light emitting device 10 includes a substrate 3, a light-emitting element 2 mounted on the substrate 3, and a light transmissive sealing member 1 directly covering the light-emitting element 2 on the substrate 3.

Figure 3:
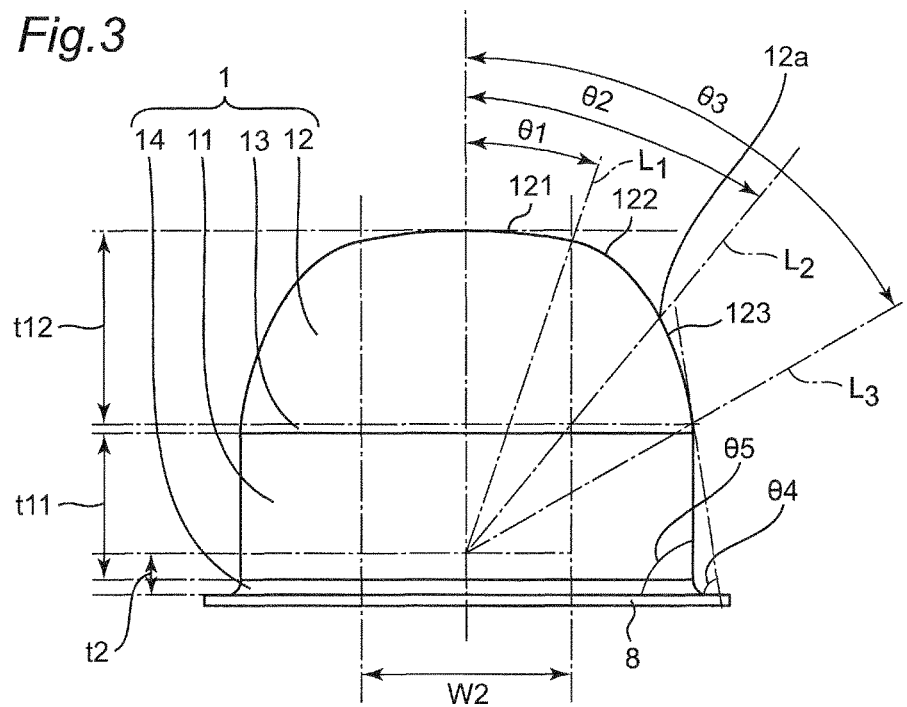
FIG. 3 is a cross-sectional view of the light transmissive sealing member of the light emitting device in the first embodiment.

FIG. 3 is a cross-sectional view of the light transmissive sealing member 1 of the light emitting device 10 of FIG. 1. As shown in FIG. 3, the light transmissive sealing member 1 has a body portion 11 and a lens portion 12 with an aspheric outer surface. The body portion 11 and the lens portion 12 are sequentially disposed from the substrate 3 side. A length of the lens portion 12 along an optical axis direction of the light transmissive sealing member is longer than a length of the body portion 11 along the optical axis direction and a maximum width Wm of a light-emitting face of the light-emitting element 2 and a diameter Di of the body portion 11 is set to satisfy the following inequality expression: 2.0 Di/Wm 1.4.

The light emitting device 10 with the arrangement described above can decrease the light intensity distribution relative to the emission angle. Therefore, the light emitting device can be provided that is capable of reducing stray light.

As used herein, the term "maximum width Wm of the light-emitting face" means, for example, a length between diagonal opposing corners of the light-emitting face in the light-emitting element 2 with a quadrangle light-emitting face, a diameter of the light-emitting face in the light-emitting element 2 with a circular light-emitting face, and a length of a major axis of the light-emitting face in the light-emitting element 2 with an ellipsoidal light-emitting face.

The term "diameter Di of the body part 11" means a diameter of a bottom surface on the substrate 3 side of the body portion 11.

The light emitting device 10 may include a protective element 4 as needed.

The structure of the light emitting device 10 will be described in detail below.

The substrate 3 of the first embodiment has a first electrode 31 and a second electrode 32 on its upper surface. The first electrode 31 and the second electrode 32 function as positive and negative wirings, respectively. As the light-emitting element 2, a light-emitting diode that emits light with a wavelength in the ultraviolet range (that is, about 200 nm to 410 nm) can be used, for example, but the light emitted is not limited thereto. The light-emitting element 2 has, for example, one of the positive and negative electrodes at an upper surface thereof on the light-emitting face side. The other electrode provided at the opposite surface thereof may be connected to the first electrode 31 on the substrate 3 via a conductive adhesive and the like, while the positive or negative electrode positioned on the upper surface may be connected to the second electrode 32 on the substrate 3 by wire bonding. Alternatively, a light-emitting element with positive and negative electrodes provided on the same surface may be used and may be flip-chip mounted. Furthermore, alternatively, one surface of a light-emitting element, which is opposite to the other surface thereof with the electrodes, may be mounted on the substrate 3, and the positive and negative electrodes may be connected to the first electrode 31 and the second electrode 32, respectively, by wire bonding.

The protective element 4 can be connected between the first electrode 31 and the second electrode 32 of the substrate 3 so as to be in parallel to the light-emitting element 2, for example.

Structure of Light Transmissive Sealing Member 1

The light transmissive sealing member 1 is provided on the substrate 3 and cover the light-emitting element such that the optical axis of the light transmissive sealing member 1 is substantially aligned with the center of a light-emitting portion of the light-emitting element 2. In the case where the protective element 4 is included, the light transmissive sealing member 1 can be provided to cover the light-emitting element 2 and the protective element 4 on the substrate 3.

Figure 2:
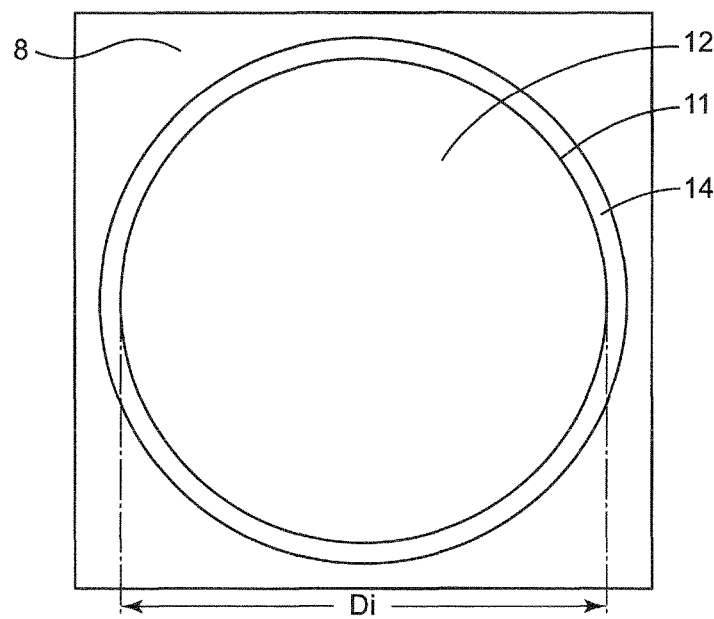
FIG. 2 is a plan view of a light transmissive sealing member of the light emitting device in the first embodiment.
Figure 4:
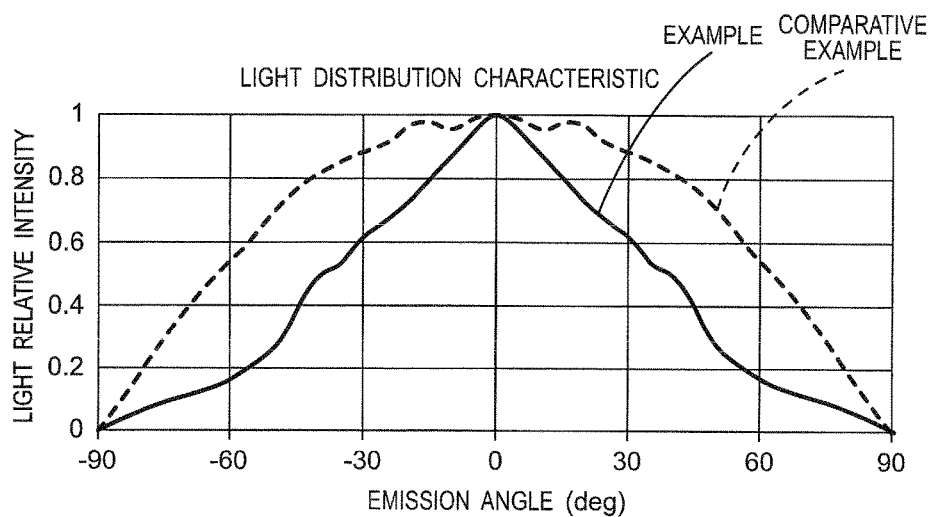
FIG. 4 is a graph showing light distribution characteristics in the light emitting device of Example 1 and a light emitting device of Comparative Example 1.

FIG. 2 is a plan view of the light transmissive sealing member of the light emitting device in the first embodiment. As noted previously, FIG. 3 is a cross-sectional view of the light transmissive sealing member of the light emitting device in the first embodiment, it is noted that, while hatching may be present on the light transmissive sealing member, any hatching has been omitted from FIG. 3 for ease of viewing. FIG. 4 is a graph showing the light distribution characteristics of the light emitting device of Example 1 according to the first embodiment and a light emitting device of Comparative Example 1.

The light transmissive sealing member 1 in the first embodiment includes the body portion 11 and the lens portion 12 that are sequentially disposed from the substrate 3 side. The shape of outer surface of the lens portion 12 is aspheric. The length of the lens portion 12 along the optical axis direction is longer than the length of the body portion 11 along the optical axis direction for increasing the relative intensity of the light emitted in the optical axis direction, as shown in FIG. 3.

Structure of Lens Portion 12

In the first embodiment, a shape of a curved surface of the lens portion 12 largely determines the light distribution characteristics of the light emitting device at emission angles in a range of 0° to ±60°. The lens portion 12 has an aspheric outer surface that includes a region between its apex as an intersection with its optical axis and its lower end on the body portion 11 side, the region having a curvature radius R smaller than that of each of the apex side and the lower end side of the lens portion. Specifically, the aspheric outer surface of the lens portion 12 includes a minimized radius position 12a where the curvature radius R is minimized between the apex and lower end of the lens portion. As shown in FIG. 3, the curvature radius R increases from the minimized radius position 12a toward the lower end side and the apex side.

The structure of the lens portion 12 will now be described. In the description below, any position on the outer surfaces of the lens portion 12 and body portion 11 is described by an angle θ formed between the optical axis of the light transmissive sealing member and a straight line L that connects an origin and the arbitrary position on the outer surface.

As used herein, the term "origin" means a light emission center. That is, the origin is an intersection point between the light-emitting face of the light-emitting element 2 and the optical axis of the light transmissive sealing member 1. Accordingly, a point where a center axis of the light distribution of the light-emitting element 2 intersects the light-emitting face of the light-emitting element is hereinafter referred to as the light emission center.

In this embodiment, the light-emitting element 2 and the light transmissive sealing member 1 are preferably disposed such that the center axis of the light distribution of the light emitting element 2 is aligned with the optical axis of the light transmissive sealing member 1.

Further, the lens portion 12 is preferably provided such that an angle θ (θ3 shown in FIG. 3) formed by the straight line $L_3$ connecting the lower end of the lens potion 12 (that is, a boundary between the lens portion 12 and the body portion 11 of the lens portion 12 on the body portion 11 side) and the origin and the optical axis is in a range 55° to 65°. The outer surface of the lens portion 12 has a flat part 121 having a large curvature radius and made substantially flat, and a curved surface part having a smaller curvature radius than that of the flat part 121. The flat part 121 is a substantially flat surface with a curvature radius R that is at least 2.8 times greater than a height t12 of the lens portion 12.

As shown in FIG. 3, the flat part 121 includes an apex of the lens portion 12, which is the intersection of the optical axis and the outer surface. The flat part 121 is a portion of the lens portion 12 defined by an angle θ1 formed by a straight line $L_1$ and the optical axis. The straight line $L_1$ is a straight line connecting a boundary between the flat part 121 and the curved surface part and the origin and the optical axis shown in FIG. 3. The curved surface part is an outer surface positioned outside the flat part 121 with an angle θ between the straight line $L_1$ in the curved surface part and the optical axis being more than θ1.

A boundary between the flat part 121 and the curved surface part is located in the position on the outer surface designated by the angle θ1 formed between the certain straight line $L_1$ and the optical axis. The angle θ1 defining the boundary is preferably set in a range of 15°≤θ1≤25°

For example, with reference to FIG. 3, the lens portion 12 may be located in the portion of the light transmissive sealing member 1 where an angle θ3 formed between a straight line $L_3$ in the lens portion and the optical axis is 60° or less. As another example, the flat part 121 of the lens portion 12 may be located in the portion of the light transmissive sealing member 1 where the angle θ1 from the optical axis is 19° or less. In the first embodiment, the region corresponding to the light-emitting element 2 in the planar view can serve as the flat part 121.

The flat part 121 can be provided such that a relative value of the size of the flat part to the radius of the lower end of the lens portion 12 is in a range of 0 to 0.47 (when the radius of the lower end of the lens portion 12 is defined as 1). In this example, the flat part 121 can be configured by setting the shape of its outer surface such that a relative value of a sag amount z is −0.0314 or less when a height from the upper surface of the light-emitting element 2 to the apex of the lens portion 12 is set at 1. The flat part 121 may include a completely flat region. As used herein, the term "sag amount (sag) z" means a distance from a straight line perpendicular to the optical axis through the apex of the light transmissive sealing member 1 to the outer surface of the light transmissive sealing member 1.

In the first embodiment, the light transmissive sealing member 1 includes the lens portion 12 in the above-mentioned range, and the flat part 121 is provided within a certain range of the lens portion 12 from the center thereof as the optical axis, so that the light relative intensity can be effectively increased on the optical axis at the emission angle of 0° in the light distribution characteristics. Accordingly, a light-intensity distribution curve can be formed in a sharp shape with an apex protruding at an emission angle of 0° (i.e., on the optical axis).

In the first embodiment, the outer surface of the lens portion 12 has the minimized radius position 12a in the curved surface part where the curvature radius R is minimized. The position 12a may be one point at a vertical cross-sectional view including the optical axis of the light transmissive sealing member 1, or otherwise may correspond to a region designated by a curved line having the same minimum curvature radius across a certain range of the light transmissive sealing member 1.

An angle $\theta 2$ between the optical axis and the straight line $L_2$ connecting between the minimized radius position 12a and the origin is preferably set in a range of $35° \leq \theta 2 \leq 45°$. Thus, the light can be effectively concentrated in the optical axis direction and emitted therefrom.

For example, if the lens portion 12 is positioned in a range represented by the coordinates where the angle $\theta 3$ between the straight line $L_3$ in the lens portion and the optical axis is 60° or less, and the substantially flat part 121 in the lens portion 12 is positioned in a range represented by the coordinates where the angle $\theta 1$ from the optical axis is 19° or less. In this case, the minimized radius position 12a where the curvature radius R is minimized is set, for example, to the position where an angle $\theta 2$ between a straight line $L_2$ at the position and the optical axis is 40°.

The curved surface part includes a first region 122 positioned from the lower end (i.e., a boundary between the flat part 121 and the curved surface part) of the flat part 121 to the minimized radius position 12a with the minimum curvature radius R, and a second region 123 positioned from the position 12a to the lower end (i.e., a boundary between the lens portion 12 and the body portion 11) of the lens portion 12.

The first region 122 can be set, for example, within a range of $19° \leq \theta 2 \leq 40°$ where the angle $\theta 2$ is an angle between the straight line $L_2$ therein and the optical axis. In that case, when the radius of the lower end of the lens portion 12 is set at 1, the first region can be provided in such a region that the relative value of the distance from the optical axis is within a range of 0.48 to 0.72. When the height from the upper surface of the light-emitting element 2 to the apex of the lens portion 12 is set at 1, the shape of the outer surface can be set such that the relative value of the sag amount z is in the range of −0.0314 to −0.277.

The second region 123 can be provided in a region where the angle $\theta 3$ from the optical axis is within a range of $40° < \theta 3 \leq 60°$, for example.

When the radius h of the lower end of the lens portion 12 is set at 1, the second region 123 can be provided in the region that restricts the relative value of the distance from the optical axis to a range of 0.73 to 1.0. When the height from the upper surface of the light-emitting element 2 to the apex of the lens portion 12 is set at 1, the shape of the outer surface can be set such that the relative value of the sag amount z is in the range of −0.277 to −0.603.

As mentioned above, the outer surface of the lens portion 12 has the aspheric convex curved surface that includes the flat part 121, the first region 122, and the second region 123 positioned in this order from the apex toward the lower end on the vertical cross-section. In the flat part 121 and the first region 122, the curvature radius R decreases as the angle from the optical axis is increased. In the second region, the curvature radius R increases as the angle from the optical axis is increased. In this embodiment, the change in curvature radius R is maximized in the first region, and the change in curvature radius R in each of the flat part and the second region is lesser as compared to the change in curvature radius R of the first region. With this arrangement, the light relative intensity can be more effectively increased on the optical axis at the emission angle of 0° in the light distribution characteristics.

Structure of Body Portion 11

The body portion 11 is provided on the substrate 3 side with respect to the lens portion 12 in the light transmissive sealing member 1. In the first embodiment, the body portion 11 is preferably provided in such a manner that the upper end of the body portion 11 on the lens portion 12 side is positioned at an angle $\theta$ formed between the straight line L therein and the optical axis in the range of 55° to 65°. The body portion 11 is configured such that an interior angle $\theta 5$ of the body portion 11 (hereinafter referred to as an interior angle $\theta 5$ of the body portion 11) formed between the outer surface of the body portion and the upper surface of the substrate 3 is larger than an interior angle $\theta 4$ of the lens portion formed between the outer surface of the lower end of the lens portion 12 and the upper surface of the substrate 3 (hereinafter referred to as an interior angle $\theta 4$ at the lower end of the lens portion 12). Thus, in the first embodiment, as shown in FIG. 3, the outer surface of the body portion 11 can is inclined inward with respect to a tangential line of the lower end of the lens portion 12. Here, the outer surface of the body portion 11 can be perpendicular to the substrate 3 (i.e., at 90°). The interior angle $\theta 4$ can be represented by an angle between a tangent line at lower end surface of the lens portion 12 and the upper surface of the substrate in a cross section including the optical axis.

Figure 6A:
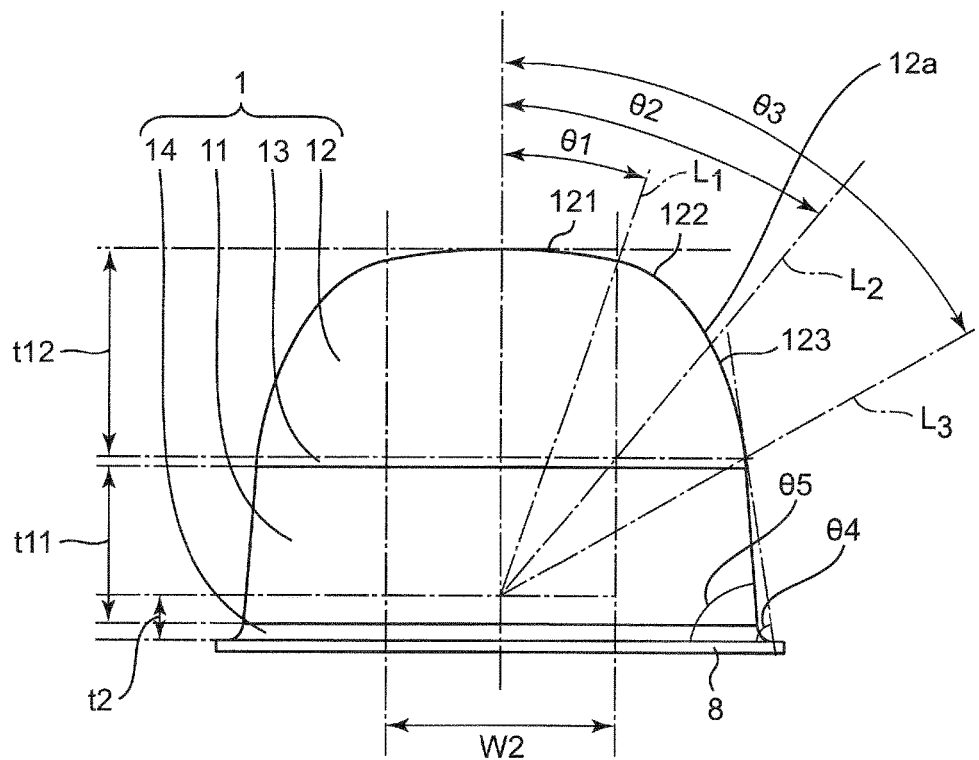
FIG. 6A is a cross-sectional view of another light transmissive sealing member with a body portion that differs in shape from a body portion shown in FIG. 3.
Figure 6B:
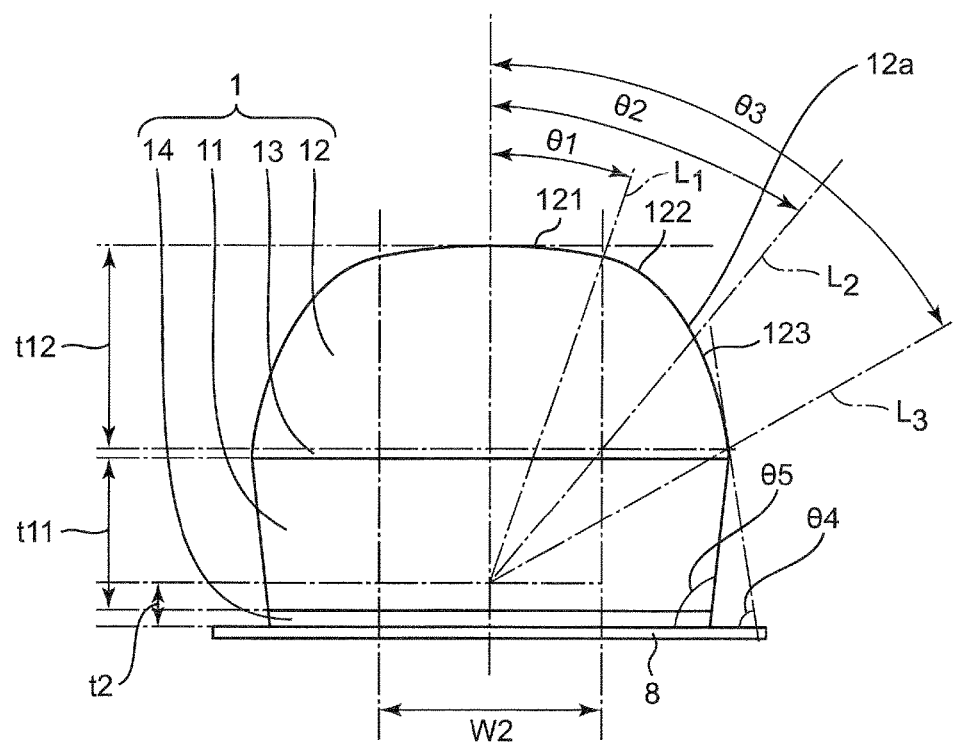
FIG. 6B is a cross-sectional view of a further light transmissive sealing member with a body portion that differs in shape from a body portion shown in FIG. 3.

According to embodiments of the present invention, the shape of the body portion 11 as defined above may be classified into the following three types:

(1) a first type of body portion 11 having its outer surface with the interior angle $\theta 5$ of the body portion 11 that is larger than the interior angle $\theta 4$ of the lower end of the lens portion 12, the outer surface being perpendicular (i.e., at 90°) to the substrate 3 as shown in FIG. 3, (that is, having a cylindrical shape or an elliptic cylindrical shape);

(2) a second type of body portion 11 having its outer surface with an interior angle $\theta 5$ of the body portion 11 that is larger than an interior angle $\theta 4$ of the lower end of the lens portion 12, the angle $\theta 5$ being smaller than 90° (that is, having a trapezoidal conical shape or an elliptic trapezoidal conical shape) as shown in FIG. 6A, and (3) a third type of body portion 11 has its outer surface with an interior angle θ5 of the body portion 11 that is larger than an interior angle θ4 of the lower end of the lens 12, the angle θ5 being larger than 90° (that is, having a reverse inclination in which the distance from the optical axis is decreased toward the substrate, also known as a reverse trapezoidal conical shape or a reverse elliptic trapezoidal conical shape) as shown in FIG. 6B.

Any of the body portion 11 types, such as the cylindrical shape, elliptic cylindrical shape, trapezoidal conical shape, elliptic trapezoidal conical shape, reverse trapezoidal conical shape, and reverse elliptic trapezoidal conical shape, may have an outer surface that has the curved outline on the cross section perpendicular to the optical axis of the light transmissive sealing member 1, and may further have the straight outline on the vertical cross section including the optical axis of the light transmissive sealing member 1.

The body portion 11 largely determines the light distribution characteristics at large emission angles of −60° to −90° and 60° to 90° more. As the interior angle θ5 of the body portion 11 is greater than the interior angle θ4 at the lower end of the lens portion 12 on the outer surface (that is, as the outer surface is reversely inclined), an incident angle of the light emitted from the light-emitting element and entering the side surface of the body portion 11 increases. Thus, more light is reflected by the side surface of the body portion 11, which may reduce the light relative intensities, and in particular, the light relative intensities at large emission angles. Accordingly, the shape of the body portion 11 is preferably cylindrical or elliptic cylindrical, for example. As another example, the light transmissive sealing member 1 can be easily molded by using a die.

The outer surface of the body portion 11 may not have a straight outline on the vertical cross-section, or may have a curved outline even on the vertical cross-section. That is, for example, the outer surface may have a modified cylindrical shape, modified elliptic cylindrical shape, modified trapezoidal conical shape, modified reverse trapezoidal conical shape, modified elliptic trapezoidal conical shape and modified reverse elliptic trapezoidal conical shape, all of which have a convex portion extending outward, etc.) Alternatively, the outer surface of the body portion 11 may have a straight outline on the cross section. For example, the body portion 11 may have a polygonal column shape, such as a quadrangular prism shape.

In the first embodiment, the height t12 in the optical axis direction of the lens portion 12 can be set in the range of 1.1 times to 1.5 times greater than a height t11 in the optical axis direction of the body portion 11, and more preferably in the range of 1.2 times to 1.4 times greater. Thus, the light extraction efficiency of the light emitting device that extracts the light from the light transmissive sealing member 1 can be kept high. The height t11 in the optical axis direction of the body portion 11 is preferably higher than the height of the coated light-emitting element 2. With this arrangement, the relative intensities of light at the large emission angles can be reduced.

As mentioned above, the light emitting device 10 may have the light transmissive sealing member 1, including the body portion 11 described above and the aspheric lens portion 12 having the flat part. As shown in FIG. 4, the change rate of an inclination of the light-intensity distribution curve at an emission angle of 0° can be maximized with this configuration, such that a sharp apex protruding on the optical axis can be formed on the curve. Such a light emitting device has the light distribution characteristics that reduce the light intensities at large emission angles, compared to a light emitting device in Comparative Example 1 that has a light transmissive sealing member with a spherical surface.

For example, the full-angle at half maximum of the light intensity distribution in terms of the emission angle can be set in a range of 70° to 80° and −70° to −80°. The light intensity at the emission angle of 60° or more can be reduced to 20% or less of the light intensity at the emission angle 0°. Therefore, the light emitting device 10 of the first embodiment has the light distribution characteristics suitable for uses where it is desired to reduce stray light (i.e., light radiated at the large emission angle).

The light distribution characteristics of the light emitting device 10 can be modified by changing the shape of the aspheric outer surface of the lens portion 12, the inclination (interior angle θ5) of the outer surface of the body portion 11 relative to the substrate 3, the ratio of the height t12 in the optical axis direction of the lens portion 12 to the height t11 in the optical axis direction of the body portion 11, and the like as appropriate.

Such light emitting devices 10 with the structures mentioned above can be arranged at certain intervals to form a light emitting module. In the use of the light emitting device 10 having the light distribution characteristics mentioned above, the light emitting devices are arranged at certain intervals, for example, of approximately 3.5 mm to 8.0 mm, which can form the light emitting module that allows for uniform radiation of the light on an object to be irradiated, such as a medium.

Coupling Portion 13, Base Portion 14, Flange 8

The light emitting device 10 in the first embodiment may further include the coupling portion 13 between the body portion 11 and the lens portion 12 as shown in FIG. 3. Furthermore, a base portion 14 may be disposed between the lower end of the body portion 11 and the substrate 3. The coupling portion 13 has, for example, substantially the same cross-sectional shape as that of each of the body portion 11 and the lens portion 12. The coupling portion 13 can be formed in the trapezoidal conical shape, the elliptic trapezoidal conical shape, etc. The base portion 14 can be provided to have its cross-sectional area increased toward the substrate 3 side. The coupling portion 13 and the base portion 14 may be provided for convenience in manufacturing, to easily mold the light transmissive sealing member 1 with a die, for example.

The shapes of the coupling portion 13 and the base portion 14 preferably do not substantially change the light distribution properties formed by the body portion 11 and the lens portion 12. However, the coupling portion 13 and the base portion 14 may have their shapes set in such a manner as to emit the light while further making it concentrate on the optical axis direction, compared to the light distribution characteristics provided only by the body portion 11 and lens portion 12, or to adjust the light distribution characteristics formed by the body portion 11 and the lens portion 12.

As shown in FIGS. 2 and 3, the light emitting device 10 may have a flange 8 spreading outward from the base portion 14. The flange 8 may have, for example, substantially the same rectangular shape as that of the substrate 3 in the planar view.

The light transmissive sealing member 1 in the first embodiment may have not only function to set the light distribution characteristics of the light emitting device, but also function to seal the light-emitting element 2, wires 5, the first and second electrodes 31 and 32, other bonding portions and the like to protect them from dust, external force, etc. To achieve these functions, the light transmissive sealing member 1 can be formed using material that has electric insulation and allows the light emitted from the light-emitting element 2 to pass therethrough. Preferably, this material has a transmission of 70% or more.

Suitable materials for the light transmissive sealing member can include, for example, a silicone resin, a modified silicon resin, an epoxy resin, a modified epoxy resin, a phenol resin, a polycarbonate resin, an acrylate resin, a TPX resin, a polynorbornene resin, and a hybrid resin containing one or more kinds of these resins. Inorganic materials, such as glass, may be used. For example, silicone resin and modified silicon resin are preferable because of the excellent resistance to heat and light as well as less volume contraction after solidification.

The components of the light emitting device 10 other than the light transmissive sealing member 1 in the first embodiment will now be described.

Light Emitting Element 2

The light-emitting element 2 can select an emission wavelength from a wide range of wavelengths from the ultraviolet to infrared by setting selection of a semiconductor material and its mixed crystal ratio as appropriate, for example, for the instant application utilizing a light emitting device. For example, a light-emitting element of a light emitting device used in an inkjet recorder or the like is configured to emit the light in the ultraviolet range. Thus, for example, the light-emitting element preferably uses a nitride semiconductor (mainly represented by a general formula $In_xAl_yGa_{1-x-y}N$ ($0 \leq x \leq 1$, $0 \leq y \leq 1$, $x+y \leq 1$) that can emit the light at a short wavelength. As another example, the light-emitting element can also use an InAlGaAs-based semiconductor, an InAlGaP-based semiconductor, a zinc sulfide, a zinc selenide, a silicon carbide, and the like.

Various outer appearances and dimensions of the light-emitting element 2 can be selected. In the first embodiment, for example, a LED chip having approximately 1.0 mm square to 2.0 mm square in the planar view and a thickness of approximately 50 μm to 400 μm can be used.

Substrate 3

The substrate 3 may be formed of a wiring board that includes wirings (such as the first electrode 31 and second electrode 32 in the first embodiment) capable of supplying current to the light-emitting element 2, and an insulating base material for holding the wirings. Examples of a base material can include ceramics such as an aluminum oxide, an aluminum nitride, a zirconium oxide, a zirconium nitride, a titanium oxide, a titanium nitride, and a mixture thereof; a thermoplastic resin, such as polyphthalamide or a liquid crystal polymer; a thermosetting resin, such as epoxy resin; and glass epoxy, glass, and paper.

Polyimide may be used for the substrate if a flexible substrate is desired. The base material may contain a white pigment, such as titanium oxide, to efficiently reflect the light from the light-emitting element 2.

Suitable materials for the wiring can include, for example, metals, such as copper, iron, nickel, chromium, aluminum, silver, gold, or titanium, and an alloy thereof. The surface of the wiring may further include a coating made of metal and the like. In addition, the substrate 3 may be configured only of wirings.

The outer appearance of the substrate 3 can be selected as appropriate and thus can have, for example, a flat-plate shape, a cavity shape, and the like. For example, the substrate may use one having a flat-plate shape of about 3.5 mm square to 7.0 mm square in the planer view and about 0.5 mm to 3.0 mm in thickness.

Embodiments of the present invention will be further illustrated through the following examples.

Example 1

In Example 1, the light emitting device 10 shown in FIG. 1 was used to simulate the light distribution characteristics.

A light-emitting element 2 in Example 1 was flip-chip mounted on a flat-plate shaped substrate 3, having dimensions of 3.5 mm² in the planar view and 0.4 mm in thickness. The light-emitting element was 1.4 mm² in the planar view and had a thickness of 0.3 mm and an emission peak wavelength of about 385 nm. The substrate 3 included electrodes (wirings) containing copper and a base material made of an alumina ceramic.

The light transmissive sealing member 1 was provided to directly cover the light-emitting element 2 over the substrate 3. The light transmissive sealing member 1 was disposed such that the optical axis is positioned at the center of the light-emitting portion of the light-emitting element 2 (that is, at the center of the light-emitting element 2 in the planar view in Example 1). In this simulation, the entire upper surface of the light-emitting element 2 was taken to be the light-emitting face. Here, the light-emitting element 2 of 1.4 mm square was used. Thus, the maximum width Wm of the light-emitting face was defined as a distance (that is, length of a diagonal line) between opposing corners of the upper surface of the light-emitting element 2, and this width was 1.98 mm.

In the light transmissive sealing member 1 of Example 1, the outer surface having an aspheric shape of the lens portion 12 was set based on the following equation (1). That is, when the optical axis of the lens portion 12 was set as the origin, the position on the outer surface of the lens portion 12 was determined by the equation below. In this equation, z is a coordinate (mm) in the height direction, and h is a coordinate (mm) in the direction perpendicular to the height direction.

$$z = \frac{ch^2}{1 + \sqrt{1-(1+K)c^2h^2}} Ah + Bh + Ch + Dh \qquad \text{Equation (1)}$$

where among high-order aspheric coefficients, A was set at 0.823421, B, C, and D as higher-order coefficients were set at zero (0), a conical constant K was set at −0.8783894, and a curvature c was set at −1.8227273.

The values of the z coordinate (mm) and h coordinate (mm) determined by Equation (1) are presented in Table 1 below. Table 1 also shows a relative value of the h coordinate determined when the radius of the lower end of the lens portion 12 was set at 1, a relative value of the z coordinate determined when the distance between the light emission center of the light-emitting element and the apex of the lens portion was set at 1, a change Δh in the relative value of the h coordinate, and a change Δz (sag amount) in the relative value of the z coordinate.

TABLE 1

| H | H (Relative value) | Z | Z (Relative value) | ΔZ (Relative value) |
|---|---|---|---|---|
| −1.5 | 1 | −1.30 | −6.03 × 10⁻¹ | −4.13 × 10⁻¹ |
| −1.2 | −0.8 | −4.08 × 10⁻¹ | −1.90 × 10⁻¹ | −1.23 × 10⁻¹ |
| −0.9 | −0.6 | −1.44 × 10⁻¹ | −6.69 × 10⁻² | −4.62 × 10⁻² |
| −0.6 | −0.4 | −4.45 × 10⁻² | −2.07 × 10⁻² | −1.67 × 10⁻² |
| −0.3 | −0.2 | −8.67 × 10⁻³ | −4.03 × 10⁻³ | −4.03 × 10⁻³ |
| 0 | 0 | 0.00 | 0.00 | 0.00 |
| 0.3 | 0.2 | −8.67 × 10⁻³ | −4.03 × 10⁻³ | −4.03 × 10⁻³ |
| 0.6 | 0.4 | −4.45 × 10⁻² | −2.07 × 10⁻² | −1.67 × 10⁻² |
| 0.9 | 0.6 | −1.44 × 10⁻¹ | −6.69 × 10⁻² | −4.62 × 10⁻² |
| 1.2 | 0.8 | −4.08 × 10⁻¹ | −1.90 × 10⁻¹ | −1.23 × 10⁻¹ |
| 1.5 | 1 | −1.30 | −6.03 × 10⁻¹ | −4.13 × 10⁻¹ |

The lens portion 12 was positioned where the angle θ3 relative to the optical axis of the light transmissive sealing member was 60° or less, and the body portion 11 was positioned where the angle θ3 was in the range of 60° to 90°.

The flat part 121 of the lens portion 12 was positioned where the angle θ1 relative to the optical axis was within a range of 0°≤θ1<20°. In Example 1, a region of 1.4 mm in diameter from the optical axis as the center was defined as the flat part. The sag amount z at the flat part 121 was set at −0.068 or less. The curvature radius R of the flat part 121 can be set in the range of, for example, approximately 2.44 to 5.27 (having an approximate value of 3.65).

The first region 122 was provided in a region represented by the coordinates where the angle θ2 from the optical axis is within a range of 20°≤θ2≤40°. In Example 1, the region of 2.2 mm in diameter from the optical axis as the center, other than the flat part 121, was defined as the first region. The sag amount z in the first region 122 was set in the range of −0.068 to −0.596. A curvature radius R of the first region 122 can be in a range of, for example, 1.44 to 2.44 (approximate value of 1.89). In a region represented by the coordinates where an angle from the optical axis was approximately 40°, the minimized radius position 12a was set in which the curvature radius R was minimized (for example, curvature radius R=1.44).

A region represented by the coordinates where an angle from the optical axis was set at 40°<θ2≤60° was defined as the second region 123. In Example 1, the region of 3.0 mm in diameter from the optical axis as the center, other than the flat part 121 and the first region 122, was defined as the second region 123. The sag amount z in the second part 123 was set in the range of −0.596 to −1.30. A curvature radius R of the second region 123 can be in a range of, for example, 1.44 to 1.50 (approximate value of 1.49). An interior angle θ4 formed between the substrate 3 and the outer surface of the lower end of the lens portion 12 (second region 123) was set at 60°. The radius of the lower end of the lens portion 12 was set at 1.49.

The light transmissive sealing member 1 in Example 1 included the coupling portion 13 between the lens portion 12 and the body portion 11. The coupling portion 13 leaded from the lens 12 to the substrate 3 side and had its outer surface formed in a modified trapezoidal conical shape with a curvature radius R of approximately 0.75.

The body portion 11 in Example 1 leaded from the lens portion 12 and the coupling portion 13 to the substrate 3 side and was formed in a cylindrical shape with a radius of 1.5 mm with an interior angle θ5 between the substrate 3 and the outer surface of the body portion 11 being 90°.

The height in the optical axis direction of the light transmissive sealing member 1 in Example 1 was 2.42 mm, and the height t12 in the optical axis direction of the lens portion 12 was 1.3 mm. In addition, the height in the optical axis direction of the coupling portion 13 was 0.12 mm, and the height t11 in the optical axis direction of the body portion 11 was 1.0 mm.

In Comparative Example 1, the light distribution characteristics of a light emitting device using a light transmissive sealing member were simulated for comparison purposes, instead of the light transmissive sealing member 1 in Example 1. The light transmissive sealing member used in Comparative Example 1 had a hemispheric surface with a radius of 1.5 mm, a height of 1.8 mm (that is, 1.5 mm in height from the center of the upper surface of the light-emitting element to the apex of the lens portion), and a curvature radius R of 1.5.

The results from Example 1 and Comparative Example 1 are shown in FIG. 4. As shown in this figure, within an area located at an angle (emission angle) not being zero degree with respect to the optical axis, the light intensity in the light emitting device 10 of Example 1 was smaller than that in the light emitting device of Comparative Example 1. More specifically, in the light-intensity distribution curve of the light emitting device in Example 1, its apex was protruded on the optical axis, and a full-angle at half maximum in terms of emission angle was set in a range of 70° to 80° and −70° to −80°. Thus, the light intensity, particularly at an emission angle of 60° or more, was reduced to 20% or less of that at an emission angle of 0°.

Figure 5:
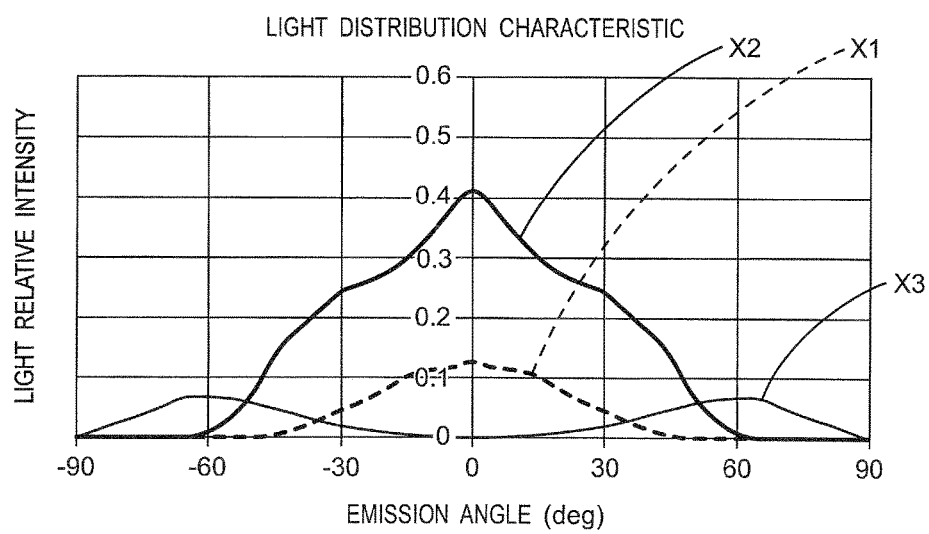
FIG. 5 is a graph showing light distribution characteristics emitted from each part of the light transmissive sealing member 1 in the light emitting device of Example 1.

FIG. 5 is a graph showing light distribution characteristics emitted from each part of the light transmissive sealing member 1 in the light emitting device of Example 1. In FIG. 5, a line X1 shows the light distribution characteristics of light emitted from the flat part of the lens portion 12; a line X2 shows the light distribution characteristics of light emitted from a part other than the flat part of the lens portion 12; and a line X3 shows the light distribution characteristics of light emitted from the outer surface of the body portion 11. As shown in FIG. 5, it could be confirmed that the light distribution characteristics at emission angles of 0° to ±60° were determined mainly by the aspheric outer surface of the lens portion 12. Further, as can be clearly seen from the figure, although the light was emitted at emission angle of −60° or less and 60° or more from the outer surface of the body portion 11, the intensity of the emitted light from the outer surface of the body portion 11 was effectively reduced, compared to the light distribution characteristics shown in Comparative Example 1 of FIG. 4.

Example 2

In Example 2, in order to confirm how the light distribution characteristics change depending on the ratio of the diameter Di of the body portion to the maximum width Wm of the light-emitting face of the light-emitting element 2, the light distribution characteristics at the respective ratio (Di/Wm) were determined by means of simulation by changing the ratio. Specifically, only the maximum width Wm of the light-emitting face was selected from parameters used in the simulation of Example 1 and changed to thereby perform the simulation.

Simulation 2a

Figure 8A:
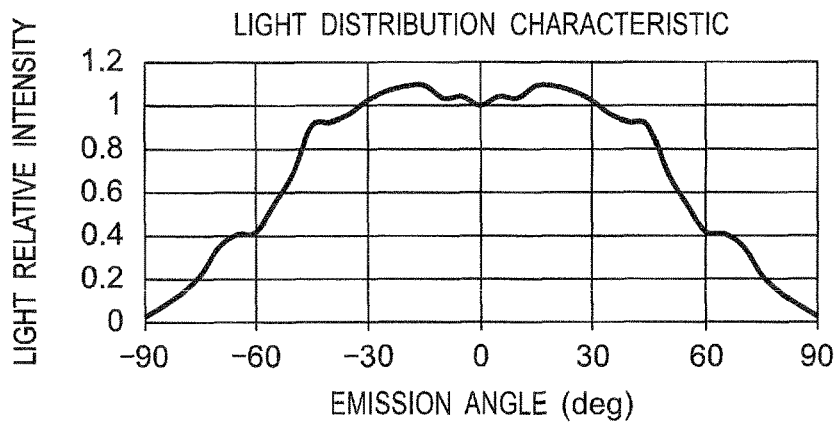
FIG. 8A is a graph showing the light distribution characteristics obtained when setting a maximum width Wm of a light-emitting face of a light-emitting element 2 such that a ratio of a diameter Di of the body portion to the maximum width Wm (Di/Wm) is 1.1 in a light emitting device of Example 2.

In simulation 2a, the maximum width Wm was set at 2.73 mm such that the ratio of the diameter Di of the body portion to the maximum width Wm of the light-emitting face of the light-emitting element 2 (Di/Wm) was 1.1. The light distribution characteristics obtained are shown in FIG. 8A.

Simulation 2b

Figure 8B:
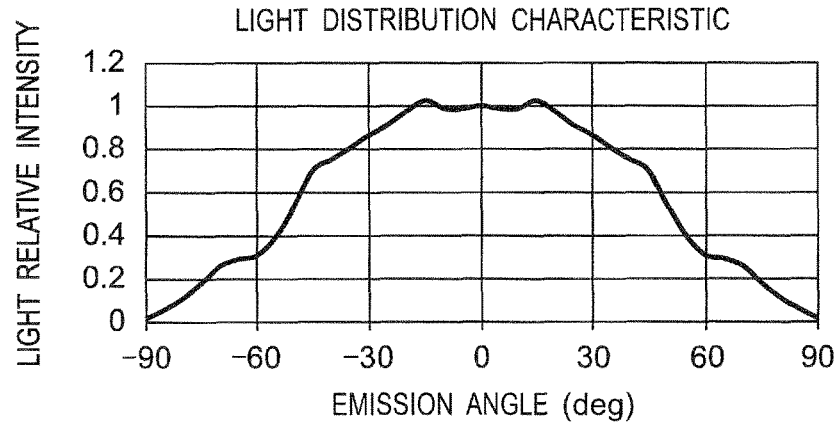
FIG. 8B is a graph showing the light distribution characteristics obtained when setting a maximum width Wm of a light-emitting face of the light-emitting element 2 such that a ratio of a diameter Di of the body portion to the maximum width Wm (Di/Wm) is 1.2 in the light emitting device of Example 2.

In simulation 2b, the maximum width Wm was set at 2.5 mm such that the ratio of the diameter Di of the body portion to the maximum width Wm of the light-emitting face of the light-emitting element 2 (Di/Wm) was 1.2. The light distribution characteristics obtained are shown in FIG. 8B.

Simulation 2c

Figure 8C:
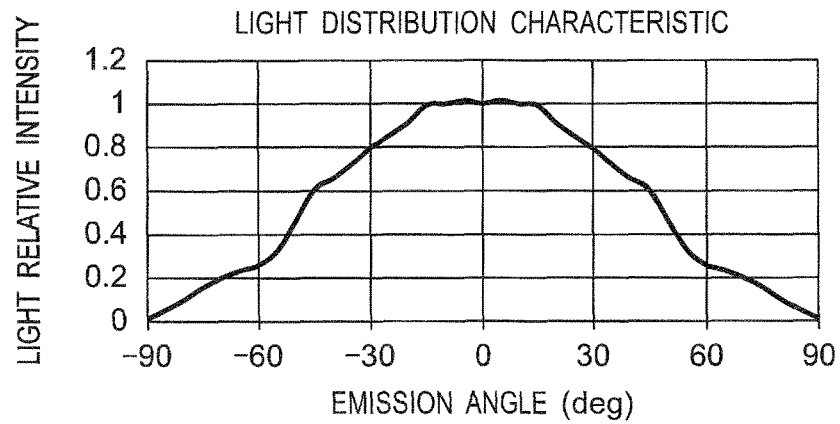
FIG. 8C is a graph showing the light distribution characteristics obtained when setting a maximum width Wm of a light-emitting face of the light-emitting element 2 such that a ratio of a diameter Di of the body portion to the maximum width Wm (Di/Wm) is 1.3 in the light emitting device of Example 2.

In simulation 2c, the maximum width Wm was set at 2.31 mm such that the ratio of the diameter Di of the body portion to the maximum width Wm of the light-emitting face of the light-emitting element 2 (Di/Wm) was 1.3. The light distribution characteristics obtained are shown in FIG. 8C.

Simulation 2d

Figure 8D:
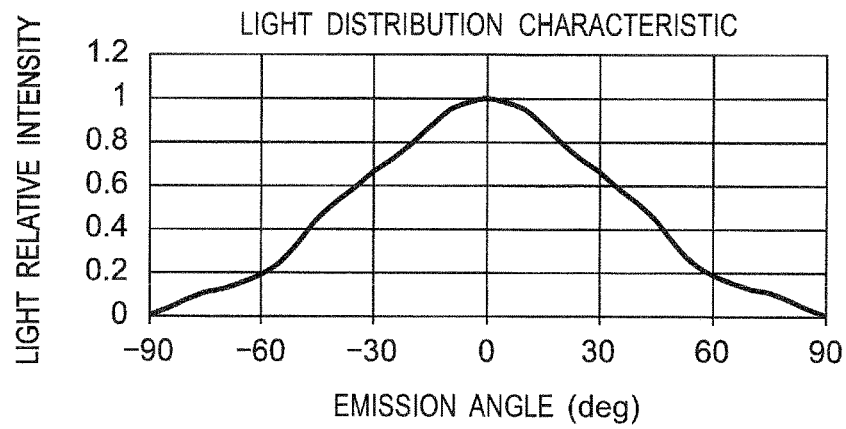
FIG. 8D is a graph showing the light distribution characteristics obtained when setting a maximum width Wm of a light-emitting face of the light-emitting element 2 such that a ratio of a diameter Di of the body portion to the maximum width Wm (Di/Wm) is 1.4 in the light emitting device of Example 2.

In simulation 2d, the maximum width Wm was set at 2.12 mm such that the ratio of the diameter Di of the body portion to the maximum width Wm of the light-emitting face of the light-emitting element 2 (Di/Wm) was 1.4. The light distribution characteristics obtained are shown in FIG. 8D.

Simulation 2e

Figure 8E:
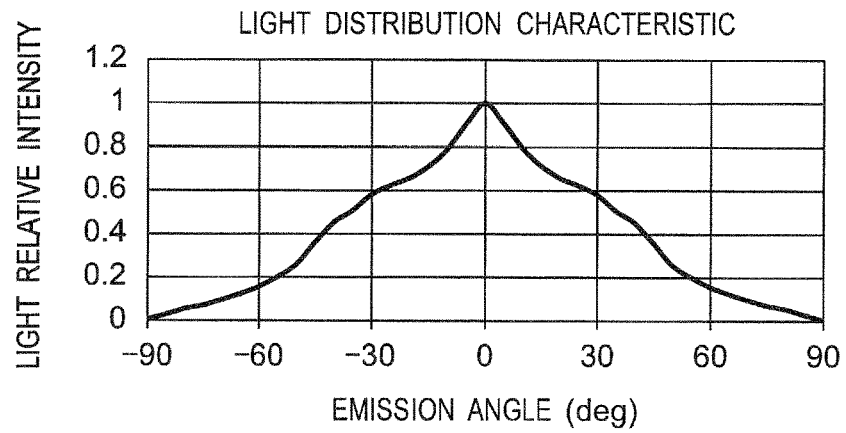
FIG. 8E is a graph showing the light distribution characteristics obtained when setting a maximum width Wm of a light-emitting face of the light-emitting element 2 such that a ratio of a diameter Di of the body portion to the maximum width Wm (Di/Wm) is 1.6 in the light emitting device of Example 2.

In simulation 2e, the maximum width Wm was set at 1.88 mm such that the ratio of the diameter Di of the body portion to the maximum width Wm of the light-emitting face of the light-emitting element 2 (Di/Wm) was 1.6. The light distribution characteristics obtained are shown in FIG. 8E.

Simulation 2f

Figure 8F:
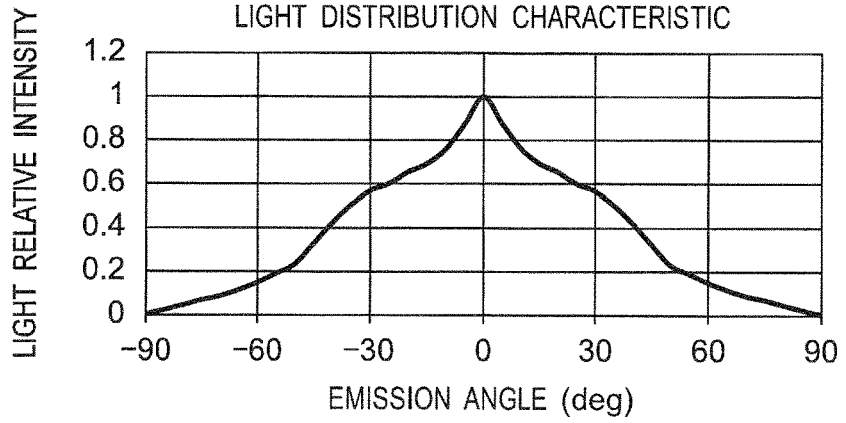
FIG. 8F is a graph showing the light distribution characteristics obtained when setting a maximum width Wm of a light-emitting face of the light-emitting element 2 such that a ratio of a diameter Di of the body portion to the maximum width Wm (Di/Wm) is 1.7 in the light emitting device of Example 2.

In simulation 2f, the maximum width Wm was set at 1.76 mm such that the ratio of the diameter Di of the body portion to the maximum width Wm of the light-emitting face of the light-emitting element 2 (Di/Wm) was 1.7. The light distribution characteristics obtained are shown in FIG. 8F.

Simulation 2g

Figure 8G:
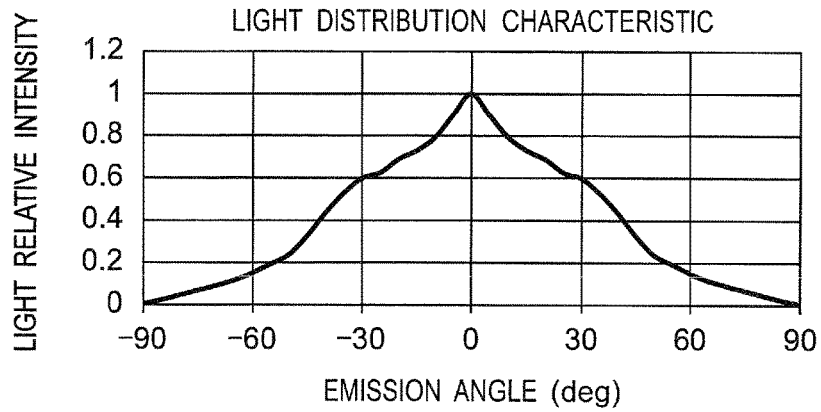
FIG. 8G is a graph showing the light distribution characteristics obtained when setting a maximum width Wm of a light-emitting face of the light-emitting element 2 such that a ratio of a diameter Di of the body portion to the maximum width Wm (Di/Wm) is 1.8 in the light emitting device of Example 2.

In simulation 2g, the maximum width Wm was set at 1.67 mm such that the ratio of the diameter Di of the body portion to the maximum width Wm of the light-emitting face of the light-emitting element 2 (Di/Wm) was 1.8. The light distribution characteristics obtained are shown in FIG. 8G.

Simulation 2h

Figure 8H:
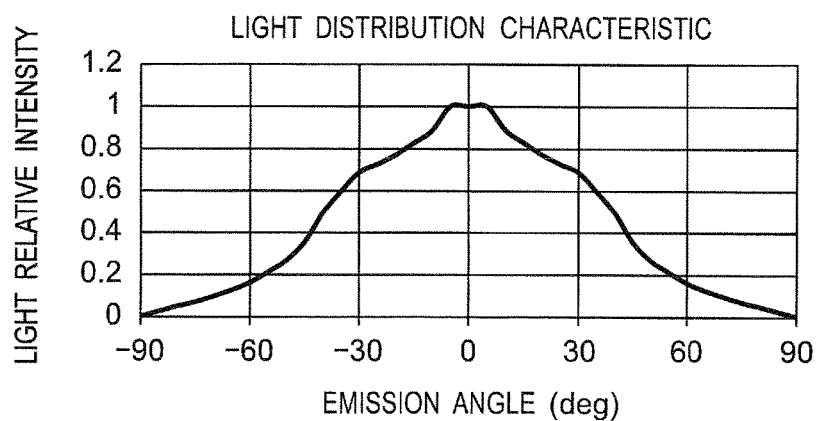
FIG. 8H is a graph showing the light distribution characteristics obtained when setting a maximum width Wm of a light-emitting face of the light-emitting element 2 such that a ratio of a diameter Di of the body portion to the maximum width Wm (Di/Wm) is 1.9 in the light emitting device of Example 2.

In simulation 2h, the maximum width Wm was set at 1.58 mm such that the ratio of the diameter Di of the body portion to the maximum width Wm of the light-emitting face of the light-emitting element 2 (Di/Wm) was 1.9. The light distribution characteristics obtained are shown in FIG. 8H.

Simulation 2i

Figure 8I:
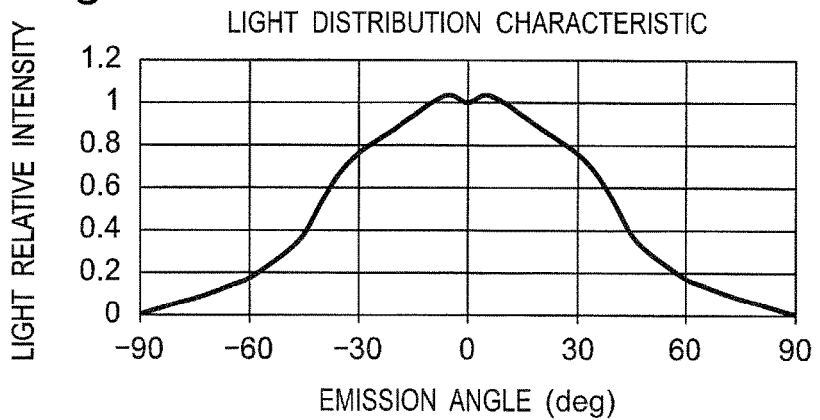
FIG. 8I is a graph showing the light distribution characteristics obtained when setting a maximum width Wm of a light-emitting face of the light-emitting element 2 such that a ratio of a diameter Di of the body portion to the maximum width Wm (Di/Wm) is 2.0 in the light emitting device of Example 2.

In simulation 2i, the maximum width Wm was set at 1.5 mm such that the ratio of the diameter Di of the body portion to the maximum width Wm of the light-emitting face of the light-emitting element 2 (Di/Wm) was 2.0. The light distribution characteristics obtained are shown in FIG. 8I.

Simulation 2j

Figure 8J:
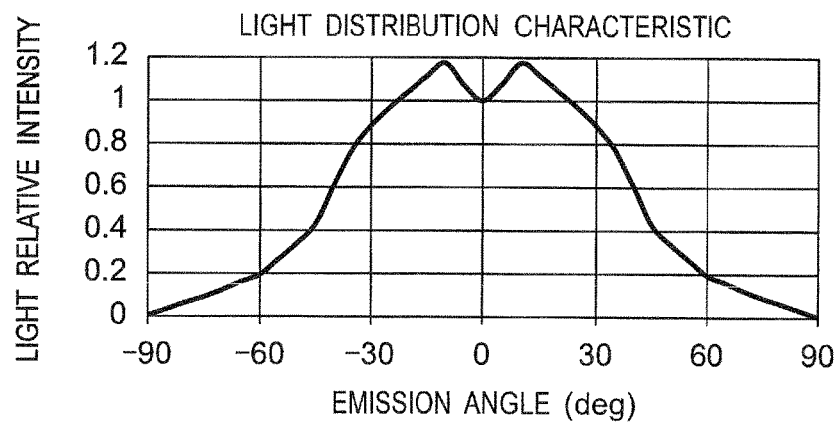
FIG. 8J is a graph showing the light distribution characteristics obtained when setting a maximum width Wm of a light-emitting face of the light-emitting element 2 such that a ratio of a diameter Di of the body portion to the maximum width Wm (Di/Wm) is 2.1 in the light emitting device of Example 2.

In simulation 2j, the maximum width Wm was set at 1.4 mm such that the ratio of the diameter Di of the body portion to the maximum width Wm of the light-emitting face of the light-emitting element 2 (Di/Wm) was 2.1. The light distribution characteristics obtained are shown in FIG. 8J.

Simulation 2k

Figure 8K:
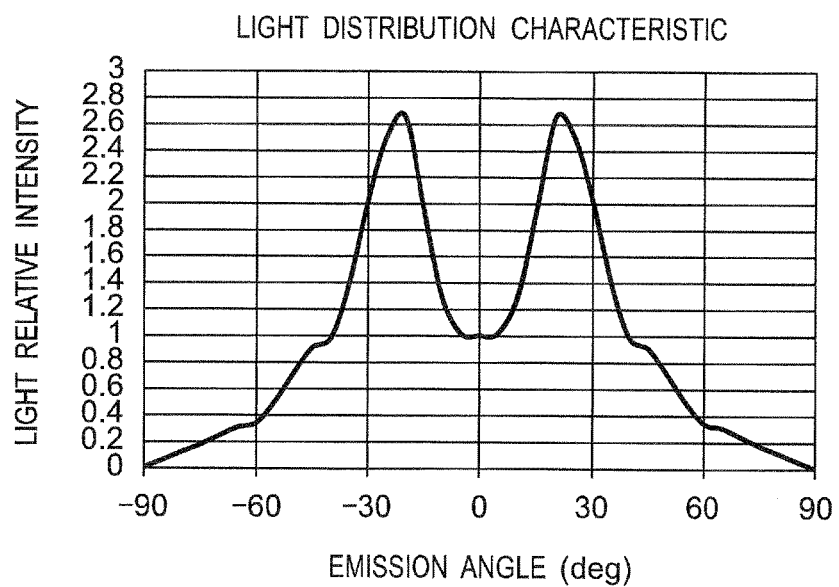
FIG. 8K is a graph showing the light distribution characteristics obtained when setting a maximum width Wm of a light-emitting face of the light-emitting element 2 such that a ratio of a diameter Di of the body portion to the maximum width Wm (Di/Wm) is 3.1 in the light emitting device of Example 2.

In simulation 2k, the maximum width Wm was set at 0.85 mm such that the ratio of the diameter Di of the body portion to the maximum width Wm of the light-emitting face of the light-emitting element 2 (Di/Wm) was 3.1. The light distribution characteristics obtained are shown in FIG. 8K.

As the result of the simulations mentioned above, the following determinations were made.

(1) The ratio of the diameter Di of the body portion to the maximum width Wm of the light-emitting face of the light-emitting element 2 (Di/Wm) was set at 1.1 or more, whereby the light relative intensity at the emission angle ±60° can be made lower than in Comparative Example, which has been explained with reference to Example 1.

(2) The ratio of the diameter Di of the body portion to the maximum width Wm of the light-emitting face of the light-emitting element 2 (Di/Wm) was set in the range of 1.3 to 2.0, whereby the light relative intensity at the emission angle ±60° as well as the light relative intensity at the emission angle ±30° can be made lower than in Comparative Example, which has been explained with reference to Example 1.

(3) The ratio of the diameter Di of the body portion to the maximum width Wm of the light-emitting face of the light-emitting element 2 (Di/Wm) was set in the range of 1.4 to 1.8, whereby the light intensity distribution curve can be formed in a convex shape with a sharp apex protruding from the position at the emission angle of 0° (that is, on the optical axis).

Based on the results of the simulations mentioned above, it was determined that the ratio of the diameter Di of the body portion to the maximum width Wm of the light-emitting face of the light-emitting element 2 (Di/Wm) was preferably set to satisfy the formula of 2.0 Di/Wm 1.3, and more preferably set to satisfy the formula of 1.8 Di/Wm 1.4. When the ratio of the diameter Di of the body portion to the maximum width Wm of the light-emitting face of the light-emitting element 2 (Di/Wm) was set to satisfy the formula of 1.8 Di/Wm 1.5, the light intensity distribution curve can be shaped to have an acute-edged, sharp apex at the position at the emission angle of 0° (on the optical axis), and further both the light relative intensity at the emission angle of ±60° as well as the light relative intensity at the emission angle of ±30° can be decreased.

Example 3

In Example 3, in order to confirm how the light distribution characteristics change depending on the ratio of the height t12 of the lens portion 12 to the height t11 of the body portion 11 (t12/t11), the light distribution characteristics at the respective ratios (t12/t11) were determined by means of simulation by changing the ratio. Only the height t11 of the body portion 11 was selected from parameters used in the simulation of Example 1 and changed to thereby perform the simulation.

Simulation 3a

Figure 9A:
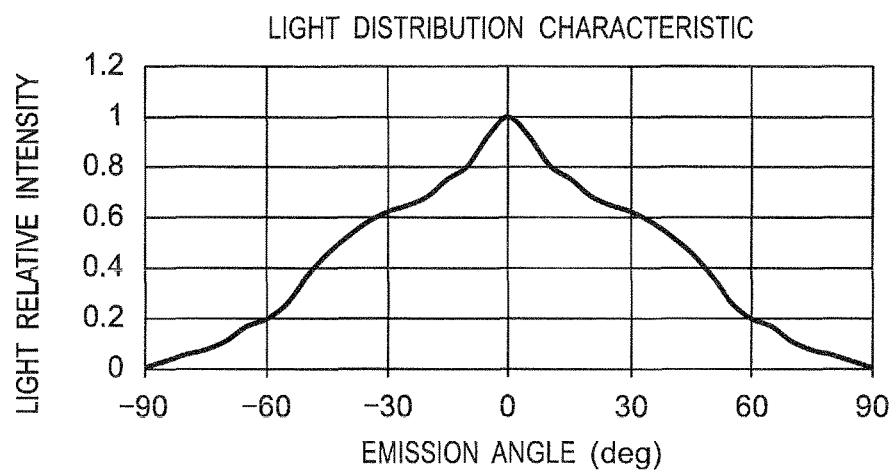
FIG. 9A is a graph showing the light distribution characteristics obtained when setting a height t11 of a body portion 11 such that a ratio of a height t12 of a lens portion 12 to the height t11 of the body portion 11 (t12/t11) is 1.5 in a light emitting device of Example 3.

In simulation 3a, a height t11 of the body portion 11 was set at 0.82 such that a ratio of a height t12 of the lens portion 12 to the height t11 of the body portion 11 (t12/t11) was 1.5. The light distribution characteristics obtained are shown in FIG. 9A.

Simulation 3b

Figure 9B:
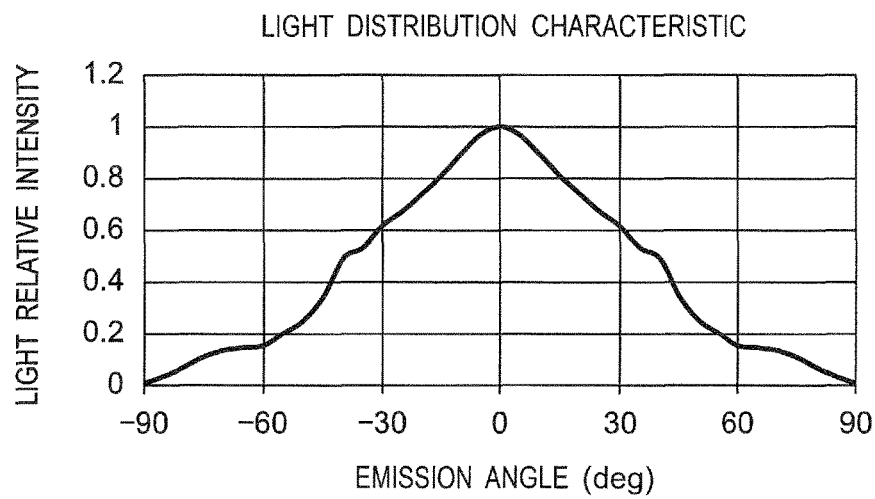
FIG. 9B is a graph showing the light distribution characteristics obtained when setting a height t11 of the body portion 11 such that a ratio of a height t12 of the lens portion 12 to the height t11 of the body portion 11 is (t12/t11) 1.1 in the light emitting device of Example 3.

In simulation 3b, a height t11 of the body portion 11 was set at 1.12 such that a ratio of a height t12 of the lens portion 12 to the height t11 of the body portion 11 (t12/t11) was 1.1. The light distribution characteristics obtained are shown in FIG. 9B.

Simulation 3c

Figure 9C:
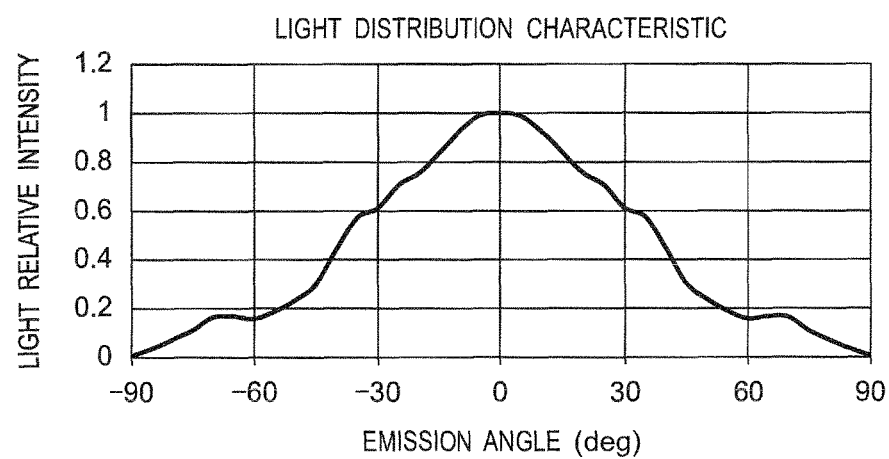
FIG. 9C is a graph showing the light distribution characteristics obtained when setting a height t11 of the body portion 11 such that a ratio of a height t12 of the lens portion 12 to the height t11 of the body portion 11 (t12/t11) is 1.0 in the light emitting device of Example 3.

In simulation 3c, a height t11 of the body portion 11 was set at 1.23 such that a ratio of a height t12 of the lens portion 12 to the height t11 of the body portion 11 (t12/t11) was 1.0. The light distribution characteristics obtained are shown in FIG. 9C.

As the result of the simulations mentioned above, the following determinations were made.

(1) The ratio of the height t12 of the lens portion 12 to the height t11 of the body portion 11 (t12/t11) was set at 1.0 or more, whereby the light relative intensity at the emission angle of ±60° as well as the light relative intensity at the emission angle of ±30° can be made lower than in Comparative Example, which has been explained with reference to Example 1.
(2) The ratio of the height t12 of the lens portion 12 to the height t11 of the body portion 11 (t12/t11) was set at 1.0 or more, whereby the light intensity distribution curve can be formed in a convex shape with a sharp apex protruding from the position at the emission angle of 0° (on the optical axis).
(3) The ratio of the height t12 of the lens portion 12 to the height t11 of the body portion 11 (t12/t11) was set in the range of 1.1 to 1.5, whereby both the light relative intensity at the emission angle ±60° as well as the light relative intensity at the emission angle ±30° can be made lower.

Example 4

In Example 4, in order to confirm how the light distribution characteristics change depending on the ratio of the diameter Di of the body portion 11 to the height t1 of the light transmissive sealing member 1 (Di/t1), the light distribution characteristics at the respective ratios (Di/t1) were determined by means of simulation by changing the ratio. Only the height t1 of the light transmissive sealing member 1 was selected from the parameters used in the simulation of Example 1 and changed to thereby perform the simulation. The height t1 of the light transmissive sealing member 1 is the total of the height t11 of the body portion 11, the height t12 of the lens portion 12, and the height t13 of the coupling portion 13. In the simulation of Example 4, the height t13 of the coupling portion 13 was set at 0.12 mm, and the ratio of the height t12 of the lens portion 12 to the height t11 of the body portion 11 (t12/t11) was set at 1.3.

Simulation 4a

Figure 10A:
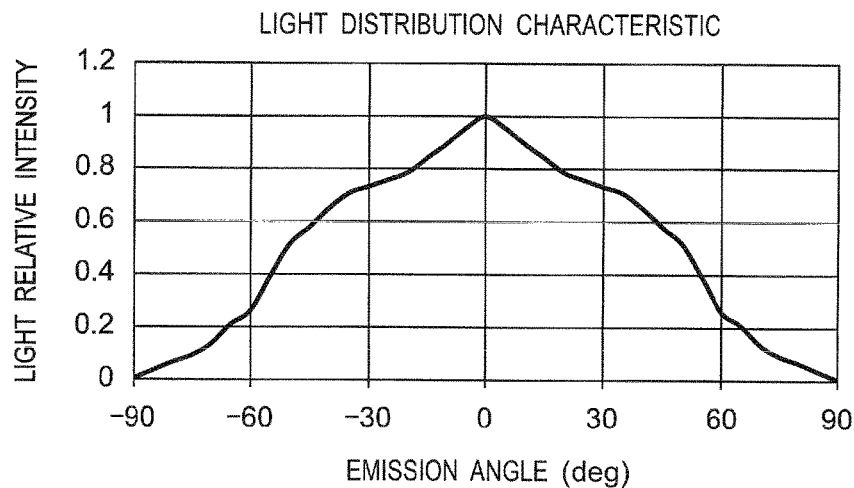
FIG. 10A is a graph showing the light distribution characteristics obtained when setting a height t11 of the body portion 11, a height t12 of the lens portion 12, and a height t13 of a coupling portion 13 such that a ratio of a diameter Di of the body portion 11 to a height t1 of a light transmissive sealing member 1 (Di/t1) is 1.4 in a light emitting device of Example 4.

In simulation 4a, the height t11 of the body portion 11, the height t12 of the lens portion 12, and the height t13 of the coupling portion 13 were set such that the ratio of the diameter Di of the body portion 11 to the height t1 of the light transmissive sealing member 1 (Di/t1) was 1.4. The light distribution characteristics obtained are shown in FIG. 10A.

Simulation 4b

Figure 10B:
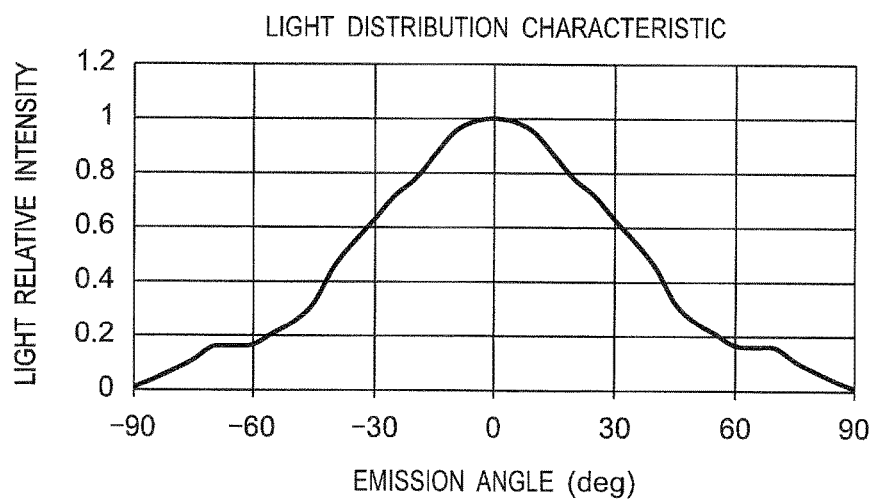
FIG. 10B is a graph showing the light distribution characteristics obtained when setting the height t11 of the body portion 11, the height t12 of the lens portion 12, and the height t13 of the coupling portion 13 such that a ratio of the diameter Di of the body portion 11 to the height t1 of the light transmissive sealing member 1 (Di/t1) is 1.1 in the light emitting device of Example 4.

In simulation 4b, the height t11 of the body portion 11, the height t12 of the lens portion 12, and the height t13 of the coupling portion 13 were set such that the ratio of the diameter Di of the body portion 11 to the height t1 of the light transmissive sealing member 1 (Di/t1) was 1.1. The light distribution characteristics obtained are shown in FIG. 10B.

As the result of the simulations mentioned above, the following determinations were made.
(1) The ratio of the diameter Di of the body portion 11 to the height t1 of the light transmissive sealing member 1 (Di/t1) was set at 1.1 or more, whereby the light relative intensity at the emission angle ±60° as well as the light relative intensity at the emission angle ±30° can be made lower than that in Comparative Example, which has been explained with reference to Example 1.
(2) The ratio of the diameter Di of the body portion 11 to the height t1 of the light transmissive sealing member 1 (Di/t1) was set at 1.1 or more, whereby the light intensity distribution curve can be formed in a convex shape with a sharp apex protruding from the position at the emission angle of 0° (on the optical axis).
(3) When the ratio of the diameter Di of the body portion 11 to the height t1 of the light transmissive sealing member 1 (Di/t1) exceeded 1.4, the light relative intensity at an emission angle from +30° to +60° as well as the light relative intensity at an emission angle from −30° to −60° tended to increase.

As mentioned above, the diameter of the light transmissive sealing member 1 (diameter Di of the body portion 11) is preferably 1.1 times to 1.4 times greater than the height of the light transmissive sealing member 1.

Second Embodiment

Figure 7A:
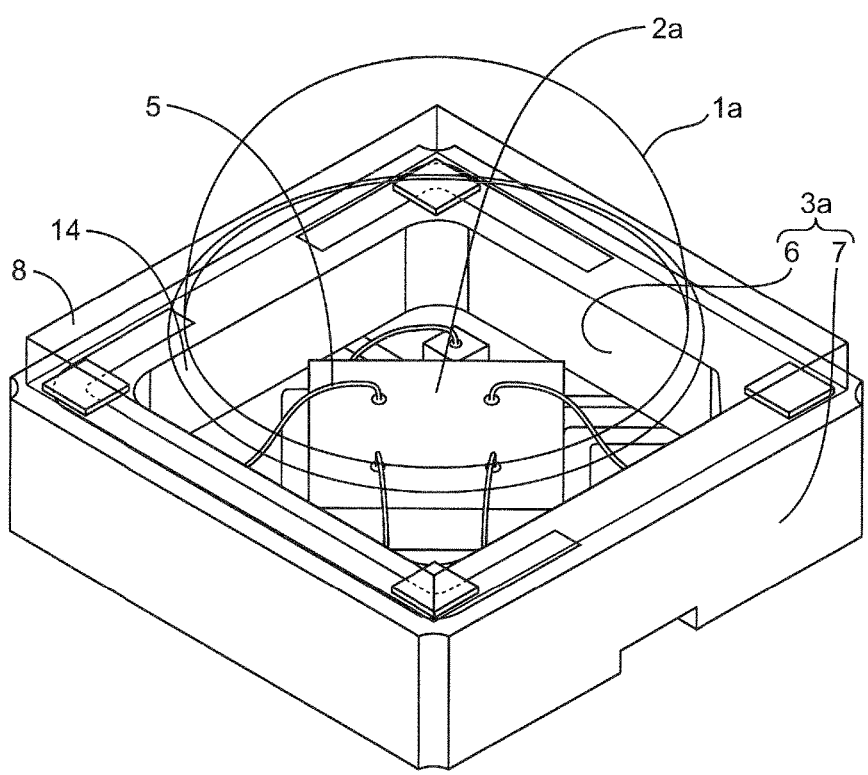
FIG. 7A is a perspective view showing the structure of a light emitting device according to a second embodiment of the present invention.
Figure 7B:
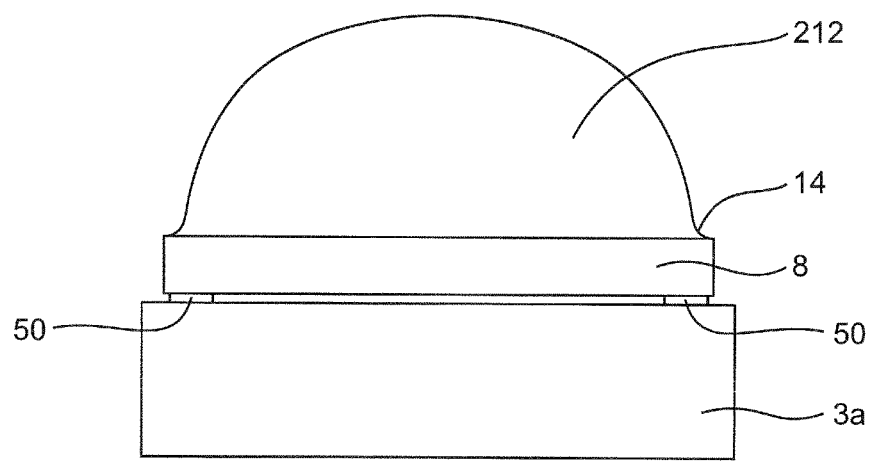
FIG. 7B is a side view of the light emitting device shown in FIG. 7A.

FIG. 7A is a perspective view showing the structure of a light emitting device 20 according to a second embodiment of the present invention. FIG. 7B is a side view of the light emitting device 20 shown in FIG. 7A. The light emitting device 20 of the second embodiment differs from the light emitting device 10 of the first embodiment primarily in the structures of the substrate and the light transmissive sealing member. Specifically, a substrate 3a with a sidewall portion 7 is used. The sidewall portion 7 has light reflecting and guiding functions, which are imparted to the side surface of the body portion 11 in the light transmissive sealing member 1 mentioned in the first embodiment. That is, the sidewall portion 7 of the substrate 3a and the light transmissive sealing member 1a in the form not containing the body portion 11 (i.e., corresponding to the lens portion 12 of the first embodiment) forms the light emitting device 20 having the light distribution characteristics that reduce the light relative intensities at large emission angles to enable suppression of the stray light.

Other components of the second embodiment can be configured by applying the equivalent components of the light emitting device 10 in the first embodiment as appropriate, and thus a detailed description thereof will be omitted.

As shown in FIG. 7A, the light emitting device 20 in the second embodiment includes the substrate 3a with a recess portion 6 enclosed by the sidewall portion 7, a light-emitting element 2a bonded to the bottom surface of the recess portion 6 (i.e., over the substrate 3a forming the bottom surface of the recess portion 6), and a light transmissive sealing member 1a bonded to the upper surface of the sidewall portion 7 to seal an opening of the recess portion 6.

Figure 7C:
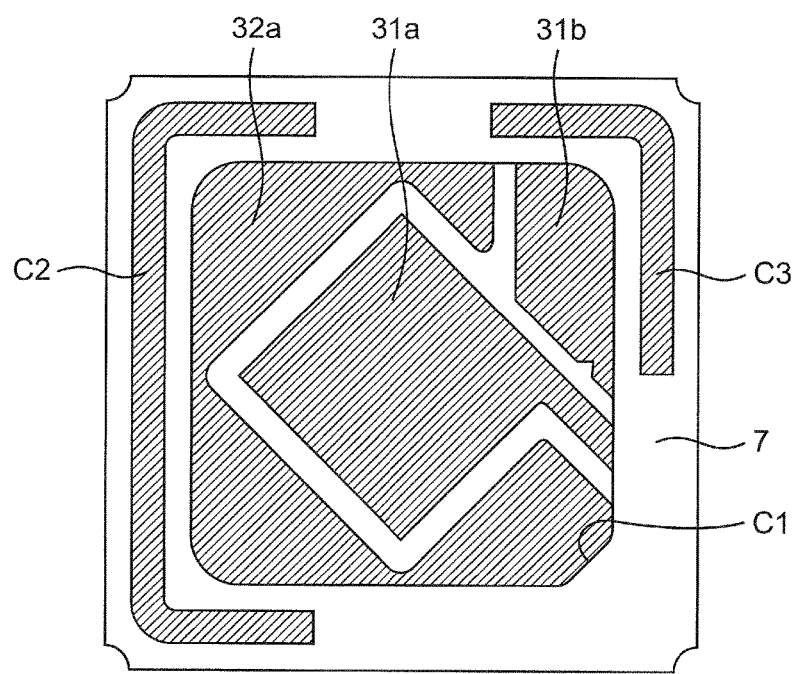
FIG. 7C is a plan view of a substrate in the light emitting device shown in FIG. 7A.

FIG. 7C is a plan view of the substrate 3a in the light emitting device 20 shown in FIG. 7A. In the second embodiment, the light-emitting element 2a having positive and negative electrodes on the same surface is mounted on wirings (i.e., anode electrode 31a and/or cathode electrode 32a) at the bottom surface of the recess portion 6a by a conductive or non-conductive adhesive. The electrodes of the light-emitting element 2a can be electrically connected to the wirings by conductive wires 5 as appropriate. In the second embodiment, the light-emitting element 2a is disposed such that the center of the light-emitting portion thereof is positioned at the center of the bottom surface of the recess portion 6 in the planer view.

The light-emitting element 2a may have the electrodes positioned on both of the upper and lower sides thereof, as in the first embodiment. Alternatively, the light-emitting element with the positive and negative electrodes formed at the same surface may be flip-chip mounted. As another example, the light-emitting element with the positive and negative electrodes formed at the same surface may be used while its surface opposite to the surface with the electrode is mounted on the wirings, and the electrodes of the light-emitting element 2a may be connected to the wirings by the conductive wires.

The emission wavelength of the light-emitting element 2a can be selected as appropriate. Any size and shape of the light-emitting element 2a can be used. For example, the light-emitting element 2a suitable for use can be one having a quadrangle shape in the planar view with a size of 1.4 mm$^2$ and a thickness of 0.3 mm. Alternatively, a hexagonal light-emitting element may be used. In addition to the light-emitting element 2a, a protective element may be disposed at the bottom surface of the recess portion 6.

In the second embodiment, the sidewall portion 7 is provided at a higher level than the upper surface of the light-emitting element 2a. The inner surface of the sidewall portion 7 in the second embodiment is preferably provided such that an angle formed with the bottom surface of the recess portion 6 is 90° or more. This arrangement enables the light emitted from the light-emitting element 2a to be effectively reflected and guided toward the lens portion 212, and thus can improve the light extraction efficiency.

In the second embodiment, the thickness of the sidewall portion 7 can be set at 0.5 mm. Thus, the light from the light-emitting element 2a that passes through the side can be reduced and effectively guided upward (i.e., toward the lens portion 212). The substrate 3a, and in particular the sidewall portion 7, can be formed in a rectangular shape having 3.5 mm×2.83 mm in the planar view, but is not limited thereto. Materials suitable for use in the substrate 3a can be the same kind of one as that in the first embodiment. In particular, ceramics, such as aluminum nitride, is preferably used in terms of the resistance to light.

In the second embodiment, the light transmissive sealing member 1a is bonded to the upper surface of the sidewall portion 7 of the substrate 3a to cover the recess portion 6. The light transmissive sealing member 1a may be bonded to the entire upper surface of the sidewall portion 7 so as to seal the opening of the recess portion 6 by considering the usage environment, thereby preventing the moisture or the like from entering the recess portion 6 and reducing degradation of the light-emitting element 2a. The light transmissive sealing member 1a is preferably disposed at the sidewall portion 7 such that the optical axis is positioned at the center of the light-emitting portion of the light-emitting element 2a.

In the second embodiment, especially, when using the light-emitting element 2a that emits the light with the wavelength of ultraviolet rays, suitable materials for use in the light transmissive sealing material 1a can preferably include inorganic materials, such as glass, in addition to the above-mentioned resin materials. This arrangement can reduce the degradation of the light transmissive sealing member 1a. Note that although in the second embodiment, the inside of the recess portion 6 is hollow, resin or other members, such as a wavelength conversion member, may be provided therein as appropriate.

The light transmissive sealing member 1a of the second embodiment has a lens portion 212 with an aspheric outer surface thereof. In the second embodiment, the lens portion 212 can be formed in an aspheric lens shape that has a region between an apex thereof as an intersection with the optical axis of the light transmissive sealing member and the lower end thereof on the substrate 3a side, the region having a curvature radius smaller than that of each of the apex side and the lower end side of the lens portion. The specific shape of the lens portion can be formed in the substantially same shape as that of the lens portion 12 of the light transmissive sealing member 1 in the first embodiment, and thus a detailed description thereof will be omitted.

The lens portion 212 with the shape mentioned above allows the light emitted from the light-emitting element 2a as well as the light reflected and guided from the light emitting element 2a toward the light transmissive sealing member 1a at the sidewall portion 7 of the substrate 3a to pass therethrough and then to be taken out of the light emitting device 20. Thus, the use of such a lens portion 212 can produce the light emitting device 20 with narrow light distribution, for example, compared to the case of using a hemisphere or flat-plate shaped light transmissive sealing portion. That is, although in the first embodiment, the body portion 11 and the lens portion 12 of the light transmissive sealing member 1 forms the light emitting device 10 having the light distribution characteristics that reduce the stray light, in the second embodiment, the sidewall portion 7 of the substrate 3a serves as the body portion 11 of the first embodiment, whereby such a sidewall portion 7 and the lens portion 212 can form the light emitting device 20 having the light distribution characteristics that reduce the stray light. For example, the light emitting device 20 can be formed in which the full-angle at half maximum of the light intensity distribution in terms of emission angle is set in a range of 60° to 70°. A light-emitting module including a plurality of light emitting devices 20 having the above-mentioned light distribution characteristics is capable of irradiating an object to be radiated, such as a medium, with uniform light, thereby reducing color unevenness.

The light transmissive sealing member 1a in the second embodiment includes a flange 8 that expands outward from its outer edge thereof at the lower end of the lens portion 212 on the side of the base portion 14. The flange 8 has, for example, substantially the same rectangular shape as that of the substrate 3a in the planar view. In the second embodiment, the light transmissive sealing member 1a is fixed to the substrate 3a (sidewall portion 7), for example, at four corners with an adhesive 50 such that the outer peripheral part (end surface) of the flange 8 is positioned above the upper surface of the sidewall portion 7 of the substrate 3a. Furthermore, in the second embodiment, the entire outer peripheral part of the flange 8 may be bonded to the upper surface of the sidewall portion 7. In this way, the light transmissive sealing member 1a can seal the recess portion 6 without any gap. The flange 8 preferably has a similar shape that is substantially the same or larger than the shape of the opening of the recess portion 6 in the planer view (the shape formed by an inner edges of the upper surface of the sidewall portion 7). Thus, for example, the light transmissive sealing member 1a may easily seal the recess portion 6 even when the shape of the opening of the recess portion 6 differs from the shape of the outer edge of the lens 212 of the light transmissive sealing member 1a.

Suitable adhesives 50 for bonding the light transmissive sealing member 1a to the substrate 3a (upper surface of the sidewall portion 7, in this embodiment) can include the above-mentioned resin material, and solders, such as Au—Sn, for example. In particular, silicone resin is preferable in terms of material cost. The adhesive 50 may be provided in a plurality of positions opposing each other (that is, near opposing sides or corners), so that the light transmissive sealing member 1a can be stably bonded to the substrate 3a. The adhesive may be provided across the entire upper surface of the sidewall portion 7. The light transmissive sealing member 1a and the substrate 3a may be coupled together by other methods, such as welding and adhesion.

In the second embodiment, for example, when the height from the bottom surface of the recess portion 6 to the upper surface of the sidewall portion 7 is set at 0.6 mm, the height (thickness) of the light transmissive sealing member 1a can be set at approximately 1.8 mm. At this time, the thickness of the lens portion 212 can be set at 1.45 mm, and the thickness of the flange 8 can be set at approximately 0.35 mm. This arrangement can form the light emitting device 20 with narrow light distribution in which a full-angle at half maximum of the light intensity distribution in terms of the emission angle can be, for example, in a range of 60° to 70°.

In the second embodiment, as shown in FIGS. 7A and 7C, the square anode electrode 31a is provided as the wiring at the center of the bottom surface of the recess portion 6, and the cathode electrode 32a is provided to surround the anode electrode 31a. Further, another anode electrode 31b is provided at one corner, separately from the anode electrode 31a and the cathode electrode 32a.

In the second embodiment, as shown in FIG. 7C, for example, the light emitting device 20 is provided with an identification mark for identifying the mounting direction of the light emitting device 20 upon mounting. Specifically, in the recess portion 6 having the substantially rectangular opening, three of four corners can be set as the R-planes, and one of them can be set as the C-plane, so that a part of the C-plane can serves as an identification mark C1.

By disposing patterns on the upper surface of the sidewall portion 7, identification marks C2 and C3 are formed. Specifically, as shown in FIG. 7C, the identification mark C2 can be formed by making a C-shaped pattern on the upper surface of the sidewall portion 7 along the outer periphery of the cathode electrode 32a located at the bottom surface of the recess portion 6, and the identification mark C3 can be formed in a L-shaped pattern along the outer periphery of the anode electrode 31b on which the protective element is placed. With above arrangement, the patterns are provided at the upper surface of the sidewall portion to thereby form the identification marks, which can reduce the difficulty in recognizing the identification marks due to the presence of the lens portion 212 and the outer edge of the flange 8.

The pattern can be formed, for example, by plating and the like. In particular, the pattern is formed from Au or the like, so that the light transmissive sealing member 1a can improve its adhesiveness when being bonded on the sidewall portion 7 with the adhesive, such as solder.

In the second embodiment, the outer surface of the lens portion 212 in the light transmissive sealing member 1a is the aspheric surface having the region between the apex as the intersection with the optical axis and the lower end of the lens portion on the substrate 3a side, the region having the smaller curvature radius than that of each of the apex side and lower end side of the lens portion. However, the present invention is not limited thereto. For example, the outer surface of the lens portion 212 may be an aspheric surface having a region with a small curvature radius, between the apex as the intersection with the optical axis and the lower end of the lens portion on the substrate 3a side. Thus, the light emitting device 20 can be formed that has the narrow light distribution characteristics that suppress the stray light.

Although the disclosure has been described with reference to several exemplary embodiments, it is to be understood that the words that have been used are words of description and illustration, rather than words of limitation. Changes may be made within the purview of the appended claims, as presently stated and as amended, without departing from the scope and spirit of the disclosure in its aspects. Although the disclosure has been described with reference to particular examples, means, and embodiments, the disclosure may be not intended to be limited to the particulars disclosed; rather the disclosure extends to all functionally equivalent structures, methods, and uses such as are within the scope of the appended claims.

The illustrations of the examples and embodiments described herein are intended to provide a general understanding of the various embodiments, and many other examples and embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more examples or embodiments of the disclosure may be referred to herein, individually and/or collectively, by the term "disclosure" merely for convenience and without intending to voluntarily limit the scope of this application to any particular disclosure or inventive concept. Moreover, although specific examples and embodiments have been illustrated and described herein, it is to be appreciated that any subsequent arrangement designed to achieve the same or similar purpose may be substituted for the specific examples or embodiments shown. This disclosure may be intended to cover any and all subsequent adaptations or variations of various examples and embodiments. Combinations of the above examples and embodiments, and other examples and embodiments not specifically described herein, will be apparent to those of skill in the art upon reviewing the description.

In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The above disclosed subject matter shall be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure may be determined by the broadest permissible interpretation of the following claims and their equivalents, and shall not be restricted or limited by the foregoing detailed description.

What is claimed is:

1. A light emitting device comprising:
   a substrate;
   a light-emitting element provided on the substrate; and
   a light transmissive sealing member consisting of a light transmissive material and covering the light-emitting element on the substrate, the light transmissive sealing member including:
      a lens portion and a body portion positioned between the lens portion and the light-emitting element, the body portion transmitting a light from the light-emitting element to the lens portion and having an outer surface exposed to the outside, a first interior angle formed between an upper surface of the substrate and the outer surface of the body portion, wherein the first interior angle is larger than a second interior angle formed between the substrate and an outer surface at a lower end of the lens portion, an outer surface of the lens portion, wherein the outer surface includes an aspheric surface that has a region located between the lower end of the lens portion on a side of the body portion and an apex as an intersection of the outer surface and an optical axis of the light transmissive sealing member, the region having a curvature radius smaller than that of each of the apex side and the lower end side of the lens portion, a first length of the lens portion along the optical axis direction, wherein the first length is longer than a second length of the body portion along the optical axis direction, and a diameter of the body portion, wherein the diameter satisfies the following expression:

$$2.0 \geq Di/Wm \geq 1.4,$$

where Di is a diameter of the body portion and Wm is a maximum width of a light-emitting face of the light-emitting element.

2. The light emitting device according to claim 1, wherein the diameter of the body portion satisfies the following expression:

$$1.8 \geq Di/Wm \geq 1.4.$$

3. The light emitting device according to claim 1, wherein an angle is formed between
  (i) a straight line that connects an upper end of the body portion on the lens portion side and an origin defined by an intersection point of the optical axis of the light transmissive sealing member and the light emitting face of the light emitting element, and
  (ii) the optical axis, and
further wherein the angle is in a range of 55° to 65°.

4. The light emitting device according to claim 1,
wherein the outer surface of the lens portion has a minimized radius position where a curvature radius is minimized between the apex and the lower end of the lens portion, and
wherein the curvature radius of the outer surface of the lens portion is enlarged from the minimized radius position toward the lower end side and the apex side.

5. The light emitting device according to claim 1, wherein the outer surface of the lens portion has a flat part with a curvature radius that is at least 2.8 times greater than a height of the lens portion.

6. The light emitting device according to claim 5, wherein the flat part is provided such that an angle is formed between
  (i) a straight line that connects a light emission center and an arbitrary point at a lower end of the flat part, and
  (ii) the optical axis of the light transmissive sealing member,
wherein the angle is in a range of 15° to 25°.

7. The light emitting device according to claim 1, wherein the body portion has one of a substantially cylindrical shape or a substantially elliptic cylindrical shape.

8. The light emitting device according to claim 1, wherein the body portion has one of a substantially reverse trapezoidal conical shape, and a substantially reverse elliptic trapezoidal conical shape.

9. The light emitting device according to claim 1, wherein the light-emitting element emits light with a wavelength in the ultraviolet range.

10. The light emitting device according to claim 1, wherein a full-angle at half maximum of the light intensity distribution is in a range of 70° to 80°.

11. The light emitting device according to claim 1, wherein the light intensity at the emission angle of 60° or more is reduced to 20% or less of the light intensity at the emission angle 0°.

12. The light emitting device according to claim 1, wherein a change rate of an inclination of the light-intensity distribution curve has a local maximum point at an emission angle of 0°.

13. The light emitting device according to claim 1, wherein a ratio of a first height t12 in the optical axis direction of the lens portion to a second height t11 in the optical axis direction of the body portion (t12/t11) is in a range of $1.1 \leq t12/t11 \leq 1.5$.

14. The light emitting device according to claim 1, wherein a ratio of a diameter Di of the light transmissive sealing member to a height h1 (Di/h1) is in a range of $1.1 \leq Di/h1 \leq 1.4$.

15. The light emitting device according to claim 1, wherein the outer surface of the lens portion has a minimized position where a curvature radius is minimized between the apex and lower end of the lens portion, and
wherein an angle is formed between
  (i) a straight line that connects a light emission center and the minimized position where a curvature radius is minimized and
  (ii) the optical axis, and
wherein the angle is in a range of 35° to 45°.

16. The light emitting device according to claim 1, wherein the light transmissive sealing member comprises a coupling portion between the lens portion and body portion.

17. A light emitting module comprising:
a plurality of the light emitting devices according to claim 1,
wherein the plurality of light emitting devices are arranged at certain intervals.

18. A light emitting device comprising:
a substrate having a recess portion enclosed by a sidewall;
a light-emitting element provided on the recess portion of the substrate; and
a light transmissive sealing member consisting of a light transmissive material and covering the light-emitting element on the substrate;
  wherein the light transmissive sealing member includes a lens portion and a base portion positioned between the lens portion and the light-emitting element, the base portion transmitting a light from the light-emitting element to the lens portion and having an outer surface exposed to the outside;
  wherein the base portion of the light transmissive sealing member includes a flange;
  wherein the flange is positioned on an upper surface of the sidewall portion of the substrate to seal the recess portion; and
  wherein an outer surface of the lens portion includes an aspheric surface having a region located between a lower end of the lens portion on a side of the body portion and an apex as an intersection of the outer surface and an optical axis of the light transmissive sealing member, the region having a curvature radius smaller than that of each of the apex side and the lower end side of the lens portion.

19. The light emitting device according to claim 18, wherein the sidewall portion of the substrate includes an inner surface, and wherein an angle of at least 90° is formed between the inner surface of the sidewall portion and the recess portion of the substrate.

20. The light emitting device according to claim 18, wherein a full-angle at half maximum of the light intensity distribution is in a range of 60° to 70°.

21. The light emitting device according to claim 18, wherein an angle is formed between a straight line that connects an upper end of the body portion on the lens portion side and an origin defined by an intersection point of the optical axis of the light transmissive sealing member and the light emitting face of the light emitting element, and (ii) the optical axis, and further wherein the angle is in a range of 55° to 65°.

22. The light emitting device according to claim 18, wherein a first length from the top of the lens portion to an upper end of the flange along the optical axis direction is longer than a second length of the body portion from the upper end of the flange to the bottom of the recess portion along the optical axis direction.

\* \* \* \* \*